United States Patent
Pedretti et al.

(10) Patent No.: US 12,205,659 B2
(45) Date of Patent: *Jan. 21, 2025

(54) ITERATIVE PROGRAMMING OF ANALOG CONTENT ADDRESSABLE MEMORY

(71) Applicant: Hewlett Packard Enterprise Development LP, Spring, TX (US)

(72) Inventors: Giacomo Pedretti, Verbania (IT); John Paul Strachan, San Carlos, CA (US); Catherine Graves, Milpitas, CA (US)

(73) Assignee: Hewlett Packard Enterprise Development LP, Spring, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/483,448

(22) Filed: Oct. 9, 2023

(65) Prior Publication Data
US 2024/0047002 A1    Feb. 8, 2024

Related U.S. Application Data

(63) Continuation of application No. 17/514,847, filed on Oct. 29, 2021, now Pat. No. 11,783,907.

(51) Int. Cl.
*G11C 27/00* (2006.01)
*G11C 15/04* (2006.01)

(52) U.S. Cl.
CPC ......... *G11C 27/005* (2013.01); *G11C 15/046* (2013.01)

(58) Field of Classification Search
CPC ................... G11C 27/005; G11C 15/046
See application file for complete search history.

(56) References Cited

U.S. PATENT DOCUMENTS

| | | | |
|---|---|---|---|
| 9,646,695 B2 | 5/2017 | Chiou et al. | |
| 9,721,661 B1 | 8/2017 | Buchanan et al. | |
| 9,847,132 B1 | 12/2017 | Zheng et al. | |
| 10,847,238 B2 | 11/2020 | Li et al. | |
| 10,998,047 B1 | 5/2021 | Li et al. | |
| 11,551,771 B2 | 1/2023 | Strachan et al. | |
| 11,561,607 B2 | 1/2023 | Graves et al. | |
| 11,783,907 B2 * | 10/2023 | Pedretti | G11C 27/005 365/45 |

\* cited by examiner

*Primary Examiner* — Son L Mai
(74) *Attorney, Agent, or Firm* — Dickinson Wright

(57) ABSTRACT

Embodiments of the disclosure provide a system, method, or computer readable medium for programming a target analog voltage range of an analog content addressable memory (aCAM) row. The method may comprise calculating a threshold current sufficient to switch a sense amplifier (SA) on and discharge a match line (ML) connected to a cell of the aCAM; and based on calculating the threshold current, programming a match threshold value by setting a memristor conductance in association with the target analog voltage range applied to a data line (DL) input. The target analog voltage range may comprise a target analog voltage range vector.

6 Claims, 20 Drawing Sheets

ITERATIVE PROGRAMMING OF ANALOG CONTENT ADDRESSABLE MEMORY

CROSS-REFERENCE TO RELATED APPLICATIONS

This application is a continuation application of and claims priority to application Ser. No. 17/514,847, filed on Oct. 29, 2021, the contents of which are hereby incorporated by reference in their entireties

BACKGROUND

Content addressable memory ("CAM") is a type of computing memory in which the stored data is not accessed by its location but rather by its content. A word, or "tag", is input to the CAM, the CAM searches for the tag in its contents and, when found, the CAM returns the address of the location where the found contents reside. CAMs are powerful, efficient, and fast. However, CAMs are also relatively large, consume a lot of power, and are relatively expensive. These drawbacks limit their applicability to select applications in which their power, efficiency, and speed are sufficiently desirable to outweigh their size, cost, and power consumption.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
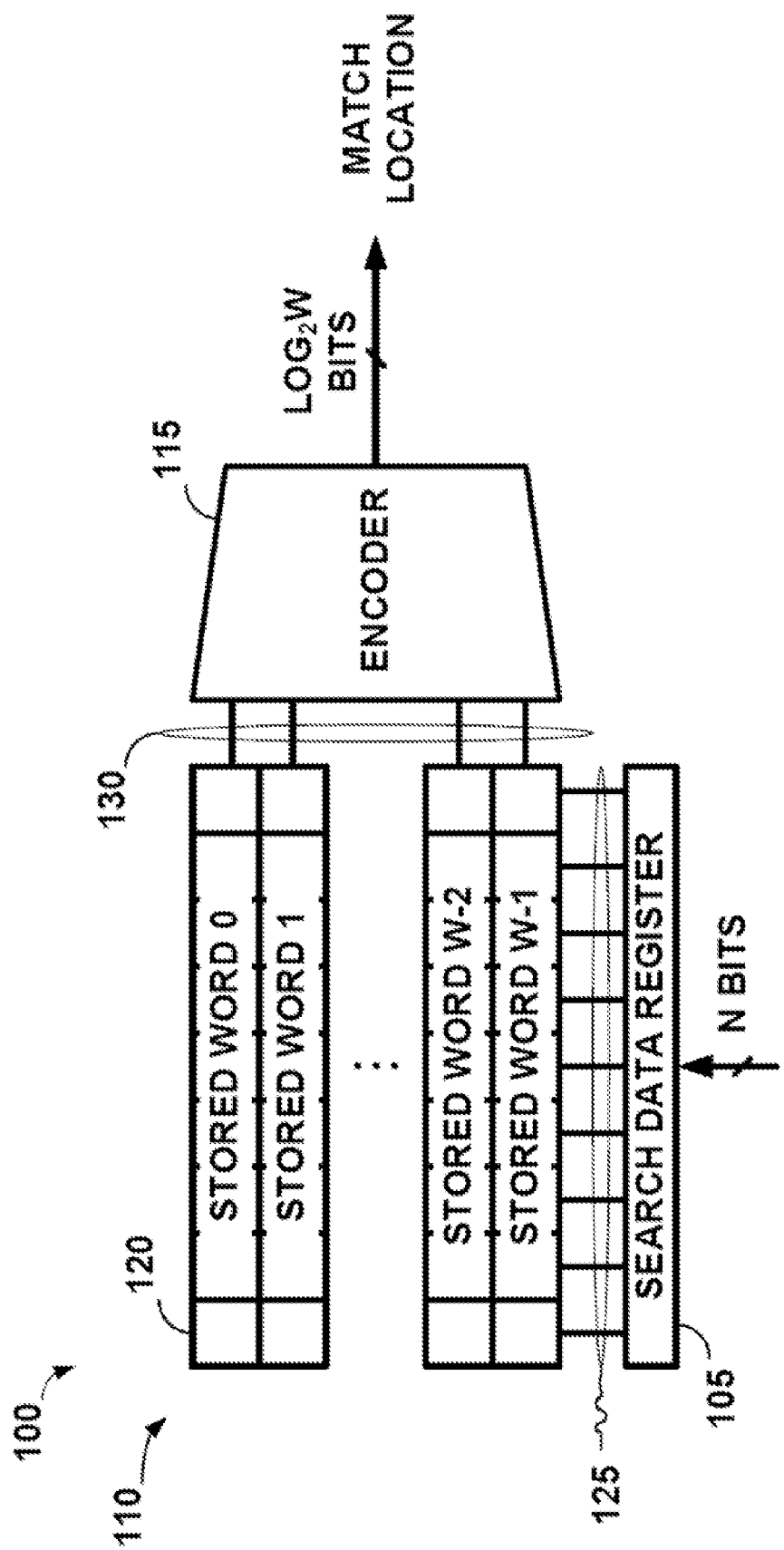
FIG. 1 conceptually depicts an analog content addressable memory ("analog CAM"), in accordance with example embodiments described herein.

The figures are not exhaustive and do not limit the present disclosure to the precise form disclosed.

DETAILED DESCRIPTION

Content addressable memory ("CAM") is hardware that compares input patterns against its stored data. The memory that stores the data in the CAM also performs the search operation at the same location, eliminating the expensive data transfer between different units in conventional hardware. During the search, all the memory cells are operating in parallel, which leads to massive throughput with applications in real-time network traffic monitoring, access control lists ("ACL"), associative memories, etc.

CAMs can be implemented in technologies that permit the CAM to hold its contents even when power is lost or otherwise removed. Thus, the data stored in a CAM can persist and can act as what is known as a "non-volatile memory." These technologies include, for instance, resistive switching memory (i.e. memristor), phase change memory, magnetoresistive memory, ferroelectric memory, some other resistive random access memory device, or combinations of those technologies.

CAMs can be categorized as "binary" or "ternary." A binary CAM ("BCAM") operates on an input pattern containing binary bits of zero and one. A ternary CAM ("TCAM") operates on an input pattern (and stores data) containing not only binary bits of zero and one, but also an "X" value. An "X" is sometimes referred to as a "don't care" or a "wildcard." In a search on the input pattern in a TCAM, an "X" will return a match on either a zero bit or a one bit. Thus, a search on the input pattern "10X1" will return a match for both "1001" and "1011." Note that both BCAMs and TCAMS use and operate on binary values of zero and one. CAMs are digital in that the data are stored in the CAM as binary values in a memory (e.g., SRAM, memristor, etc.) and the input patterns are represented by zeros and ones. Each memory cell in the CAM processes one value at a time (either 0/1 or 0/1/X), which limits the memory density and the power efficiency.

The present disclosure provides an analog CAM ("aCAM") circuit that searches multilevel voltages and stores analog values in a nonvolatile memory (e.g., memristor). One analog cell can implement a function that is equivalent to multiple digital CAM cells, leading to significant advantages in area and power saving in implementing certain CAM-based functions. The aCAM circuit can be driven with standard multi-level digital values, or directly with analog signals, giving additional potential for increased functionality while removing the need for expensive analog-digital conversion. More particularly, an aCAM cell outputs a match when the analog input voltage matches a target analog voltage range that is defined by the aCAM cell.

In some examples, an aCAM can be programmed to match all values between a "high value" and a "low value," or within a target analog voltage range, where the range includes non-binary values. These high and low values are set by programming memristors, and so are referred to as "$R_{high}$" and "$R_{low}$" herein. $R_{high}$ and $R_{low}$ set bounds of the range of values that may be stored in the cell such that the cell may store analog values. A memory cell in an aCAM may store any value between the value defined by $R_{high}$ and the value defined by $R_{low}$. If $R_{high}=R_{max}$, where $R_{max}$ is the maximum resistance of a memristor, and $R_{low}=R_{min}$, where $R_{min}$ is the minimum resistance of a memristor, then the stored value is an "X," as in a Ternary CAM. The number of equivalent digital cells or bits that can be stored in an analog CAM cell depends on the number of states the programmable resistor can be programmed to. To be able to encode the equivalent of n bits (i.e., n binary CAM/TCAM cells), the programmable resistor has $2_n+1$ states.

The memristor-based aCAM can search analog voltages and store analog values (or digital values) as the value(s) which fall in between $R_{low}$ and $R_{high}$ which are set by the multilevel resistance of the memristors. One example of an aCAM includes a plurality of cells arranged in rows and columns. Each cell performs two analog comparisons: "greater than" and "less than" to the searched data line (DL) voltage at the same time, with significantly reduced processing time and energy consumption comparing to its digital counterpart. The aCAM can be driven with standard multi-level digital values or directly with analog signals in various examples. This provides additional potential for increased functionality when removing the need for expensive analog-digital conversion. The significant power saving of the proposed memristor aCAM enables the application of CAMs to more generalized computation and other novel application scenarios.

Structurally, each memory cell of the aCAM can include a "high side" that sets the high value and a "low side" that sets the low value. Each side of the cell includes a memristor and a pair of transistors in some examples. The memristor and one of the transistors create a voltage divider and the memristor is programmed to define either $R_{high}$ or $R_{low}$ and, hence, the high value or the low value. The second transistor provide a threshold function to determine from the voltage divider whether the searched data (in the case of the high side) is below the high threshold or (in the case of the low side), is below the low threshold. If there is a match, then a match is indicated on a match line (ML) in that neither transistor activates to discharge or pull down the match line (ML). An aCAM includes an array of such cells, a search data register into which the input pattern is loaded, and an encoder that produces a match location from the match lines (ML).

Note, however, that the structures shown herein by which the aCAM cells may be implemented are but illustrative means by which the aCAM cells may be implemented. Those skilled in the art having the benefit of this disclosure may realize other, alternative structures by which the disclosed functions of the aCAM cells may be performed. Accordingly, the subject matter claimed below includes not only those means disclosed herein, but also equivalent structures performing the disclosed functions.

More particularly, in some examples, an aCAM cell includes a high side and a low side. The high side encodes a high bound on a range of values and includes a first voltage divider formed by a first programmable resistor and a first electronically controlled variable resistor. The low side encodes a low bound on the range of values and includes a second voltage divider formed by a second programmable resistor and a second electronically controlled variable resistor.

In some examples, traditional programming of each aCAM cell may be affected by the parasitic capacitance on the match line (ML) which contributes to an overall capacitance to discharge during a mismatch. Given a vector of input values on the data line (DL), input values that are close to the stored thresholds may partially activate the discharge transistor to contribute to an overall leakage that could discharge the match line (ML). Thus, to improve programming of a target analog voltage range in the aCAM and increase usability of the aCAM, the contribution of each cell could be considered along with the overall match line (ML) capacitance.

Embodiments of the disclosure provide a system, method, or computer readable medium for programming a target analog voltage range of an analog content addressable memory (aCAM) row. The method may comprise calculating a threshold current sufficient to switch a sense amplifier (SA) on and discharge a match line (ML) connected to a cell of the aCAM; and based on calculating the threshold current, programming a match threshold value by setting a memristor conductance in association with the target analog voltage range applied to a data line (DL) input. The target analog voltage range may comprise a target analog voltage range vector.

The process may test the target analog voltage range using a variety of methods. For example, the target analog voltage range may be tested by applying a lower threshold value of the target analog voltage range data line (DL) and calculating a voltage value on the match line (ML) after a clock time; comparing the voltage value to a sense threshold voltage of the sense amplifier (SA); and when the voltage value is below the sense threshold voltage, decreasing the threshold current and adjusting the memristor conductance. In another example, the target analog voltage range may be tested by applying an upper threshold value of the target analog voltage range data line (DL) and calculating a voltage value on the match line (ML) after a clock time; comparing the voltage value to a sense threshold voltage of the sense amplifier (SA); and when the voltage value is below the sense threshold voltage, decreasing the threshold current and adjusting the memristor conductance.

In either testing example, the process may identify the voltage value in comparison with a sense voltage of the sense amplifier. When the voltage value is below the sense voltage of the SA, the process may calculate a second threshold current sufficient to switch the sense amplifier (SA) on. In another example, when the voltage value is below the sense voltage of the SA, the process may increase the sense voltage of the SA. In another example, when the voltage value is below the sense voltage of the SA, the process may increase the memristor conductance.

Embodiments of the disclosure may also describe an improved circuit for efficiently implementing a programming method in hardware. The circuit may comprise an analog content addressable memory (aCAM) array; a digital-to-analog converter (DAC) circuit block; a pre charge circuit block (PC); a programming circuit block (PM); a sense amplifier circuit block; and a digital signal processing (DSP) unit controlling the system.

These systems may provide systems, methods, and computer readable media for encoding logical rules, such as a domain-related logical ruleset, in an aCAM so as to enable rapid, parallel searching of the encoded rules, storing and searching flexible parameter values, storing and searching analog ranges of values, and fuzzy matching on stored values or stored ranges of values.

Turning now to the drawings, the aCAM disclosed herein may be used in digital or analog applications to perform traditional TCAM functions and operations.

FIG. 1 conceptually depicts an analog content addressable memory ("analog CAM"), in accordance with example embodiments described herein. In this illustration, aCAM 100 is used in a digital application in which input search patterns and the values stored in aCAM 100 are digital. aCAM 100 may include search data register 105, analog cell array 110, encoder 115, plurality of analog cells 120, plurality of search lines 125, and match line 130.

Analog cell array 110 stores W "stored words" 0 through W−1. Each stored word is a pattern of values, at least some of which may be analog values as described below. Search data register 105, in use, may be loaded with an analog or binary input pattern that can be searched for among the contents of analog cell array 110. The example of FIG. 1 operates on a binary input pattern as indicated by the "n bits" going to the data line register. An example operating on an analog search pattern is discussed further herein. Thus, instead of storing two bits of data in two columns as is the case for a digital CAM, one column of the aCAM cells can encode four analog values.

Figure 2:
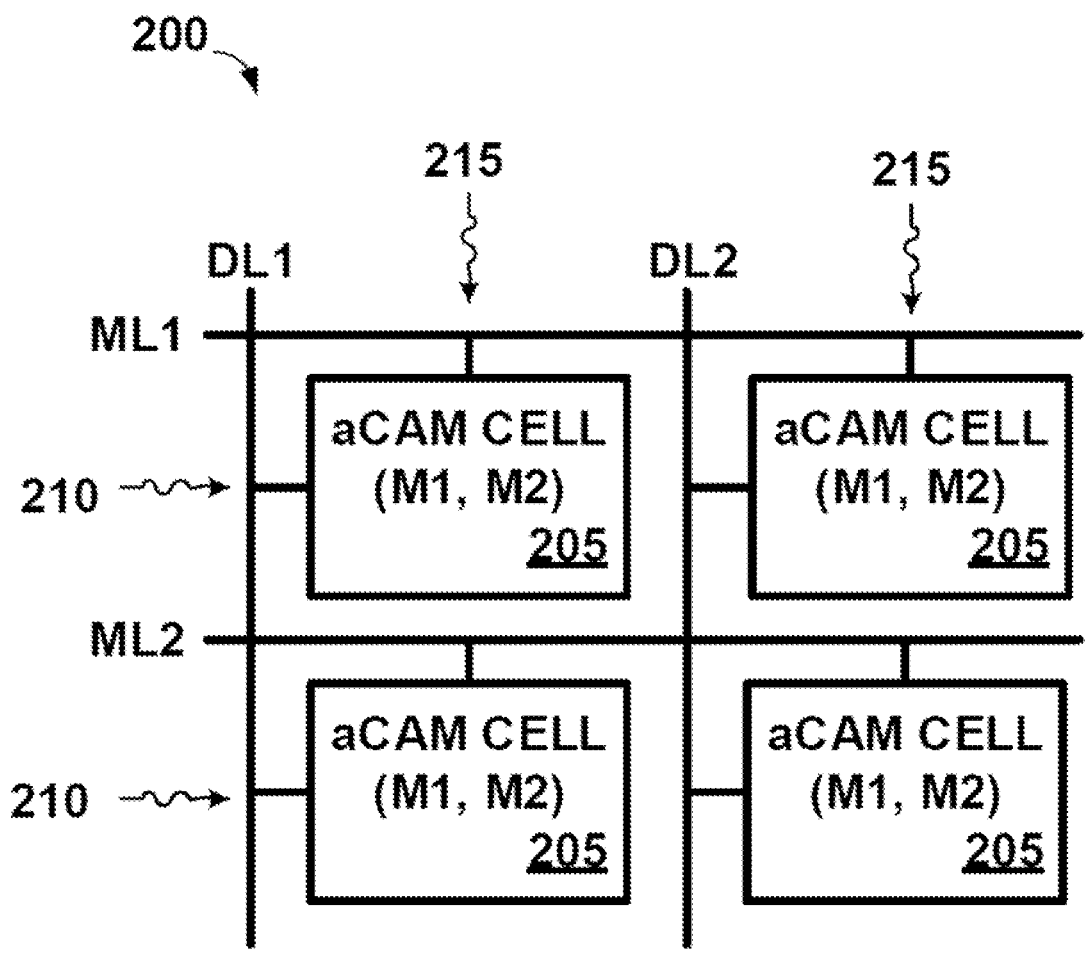
FIG. 2 illustrates selected portions of an analog cell array of an aCAM, in accordance with example embodiments described herein.

Analog cell array 110 includes a plurality of analog cells 120 (only one indicated) arranged in rows and columns as shown in FIG. 2 and discussed further below. During a search, the analog input pattern loaded into search data register 105 is communicated to analog cell array 110 over a plurality of search lines 125. Some examples may use data lines in addition to or in lieu of search lines. Each cell 120 then indicates whether a value of the analog input pattern is matched by a range of values contained in cell 120, where the range of values including non-binary values.

The indications of whether the cells contain matches are communicated to encoder 115 over a plurality of match lines 130. Note that a match is found if the searched word (or pattern) matches the stored word within a single row. The match lines do not output the matches of individual cells, but whether the stored row word matches the searched data (row). More particularly, that match lines 130 are precharged high along rows, data is searched on search lines 125 (or data lines) along columns, and if a mismatch between searched and stored content occurs, the plurality of match lines 130 discharge and goes low. If a match occurs, the match line 130 stays high.

Encoder 115 is a priority encoder that returns a match location with analog cell array 110. Note that encoder 115 may be omitted in some examples, particularly in examples in which multiple match locations are identified and desired. For instance, because the "don't care" values may be included in the input pattern, multiple matches among the W stored words may be found. Some examples might wish to identify more than one, or even all, match locations and these examples would omit encoder 115.

FIG. 2 illustrates selected portions of an analog cell array of an aCAM, in accordance with example embodiments described herein. In this example, portions of aCAM 100 are provided, including selected portions of analog cell array 200. aCAM cells 205 are arranged in rows 210 and columns 215 and are each individually searchable over the data lines DL1, DL2. Whether a match is found from data on DL1 and DL2 and the data stored in the rows by each aCAM cell's M1 and M2 programmed values is indicated over the match lines ML1, ML2. As those in the art having the benefit of this disclosure will appreciate, analog cell array 200 may be larger than a 2×2 array, as illustrated in FIG. 2. The precise size can be implementation specific. The 2×2 portion is shown for illustrative purposes and is not limiting. Each aCAM cell 205 includes two memristors M1, M2 (not separately shown) that are used to define the range of values stored in the respective aCAM cell 205.

Figure 3:
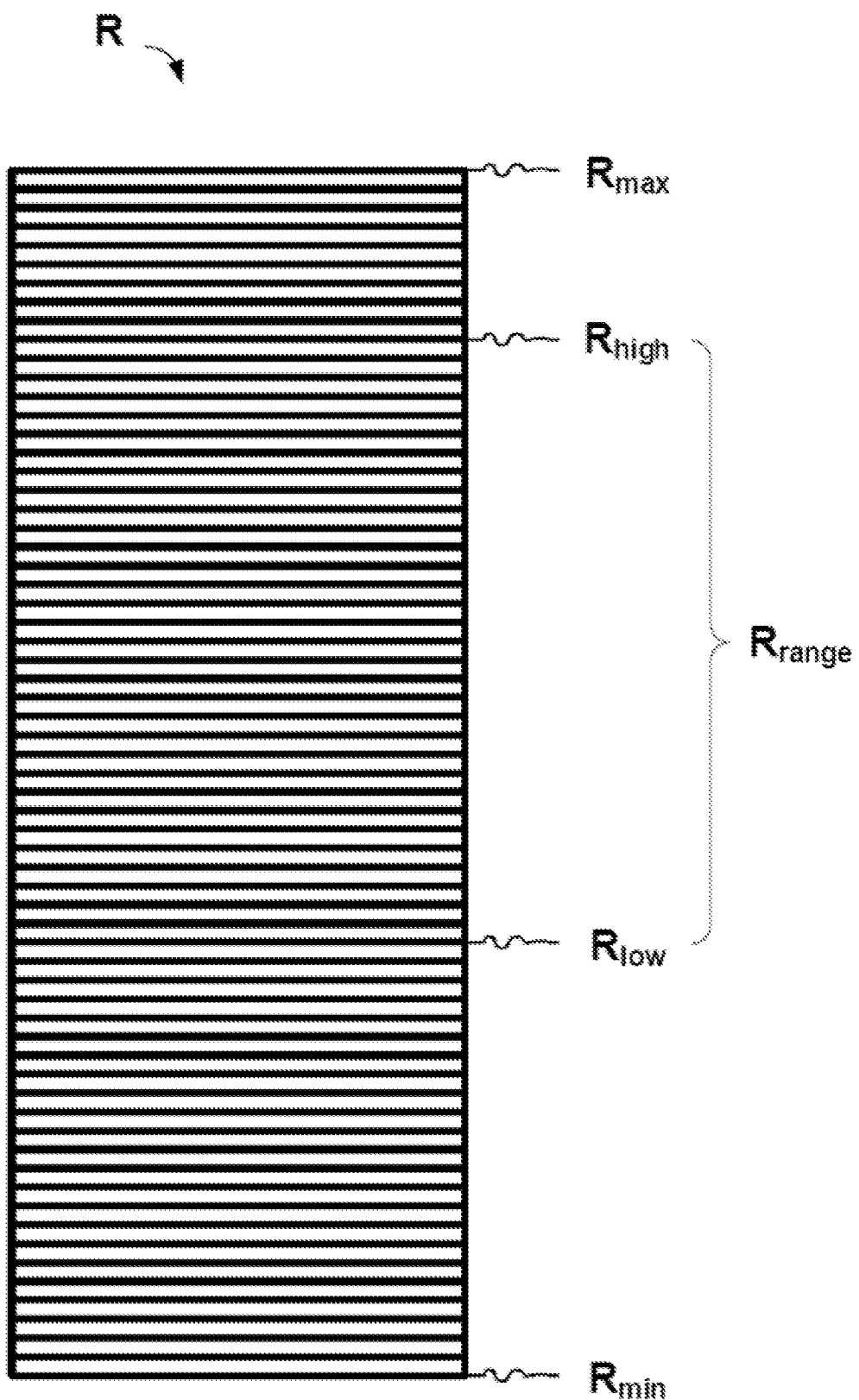
FIG. 3 conceptually illustrates a resistance differential, in accordance with example embodiments described herein.

FIG. 3 conceptually illustrates a resistance differential that may be used to set the stored analog value or range of aCAM cells 205 in FIG. 2 in some examples. The total range of resistance R that may be implemented by both memristors M1, M2 is defined by a maximum resistance $R_{max}$ and a minimum resistance $R_{min}$. A range of resistance $R_{range}$ is defined by $R_{high}$ and $R_{low}$. $R_{high}$ is determined by programming a value in M1 and $R_{low}$ is determined by programming a value in M2. When an analog value is stored, the analog number is encoded in the cell via two resistance thresholds, a high and a low resistance threshold within which the analog value of the cell (or range value) resides. Several electronic circuits by which aCAM cells 205 may be implemented will be discussed further below.

In some examples, more than three levels may be programmed in a content addressable memory. In a memristor CAM, the information may be ultimately mapped to resistance levels and there are $2^n+1$ distinct resistance levels between $R_{low}$ and $R_{high}$. That is, $R_{range}=R_{high}-R_{low}$ and includes $2^n+1$ distinct resistance levels, each distinct resistance level representing a different value. For example, where $R_{high} \neq R_{low}$ and $R_{high}>R_{low}$, then aCAM cell 205 stores all levels between $R_{low}$ and $R_{high}$. For another example, if $R_{high}=R_{max}$ and $R_{low}=R_{min}$, then aCAM cell 205 stores an X="do not care" value. For yet another example, if $R_{high}$=a resistance R1 and $R_{low}$=R1−delta where delta= $(R_{max}-R_{min})/(2^n)$, then aCAM cell 205 stores the single level R1.

Figure 4:
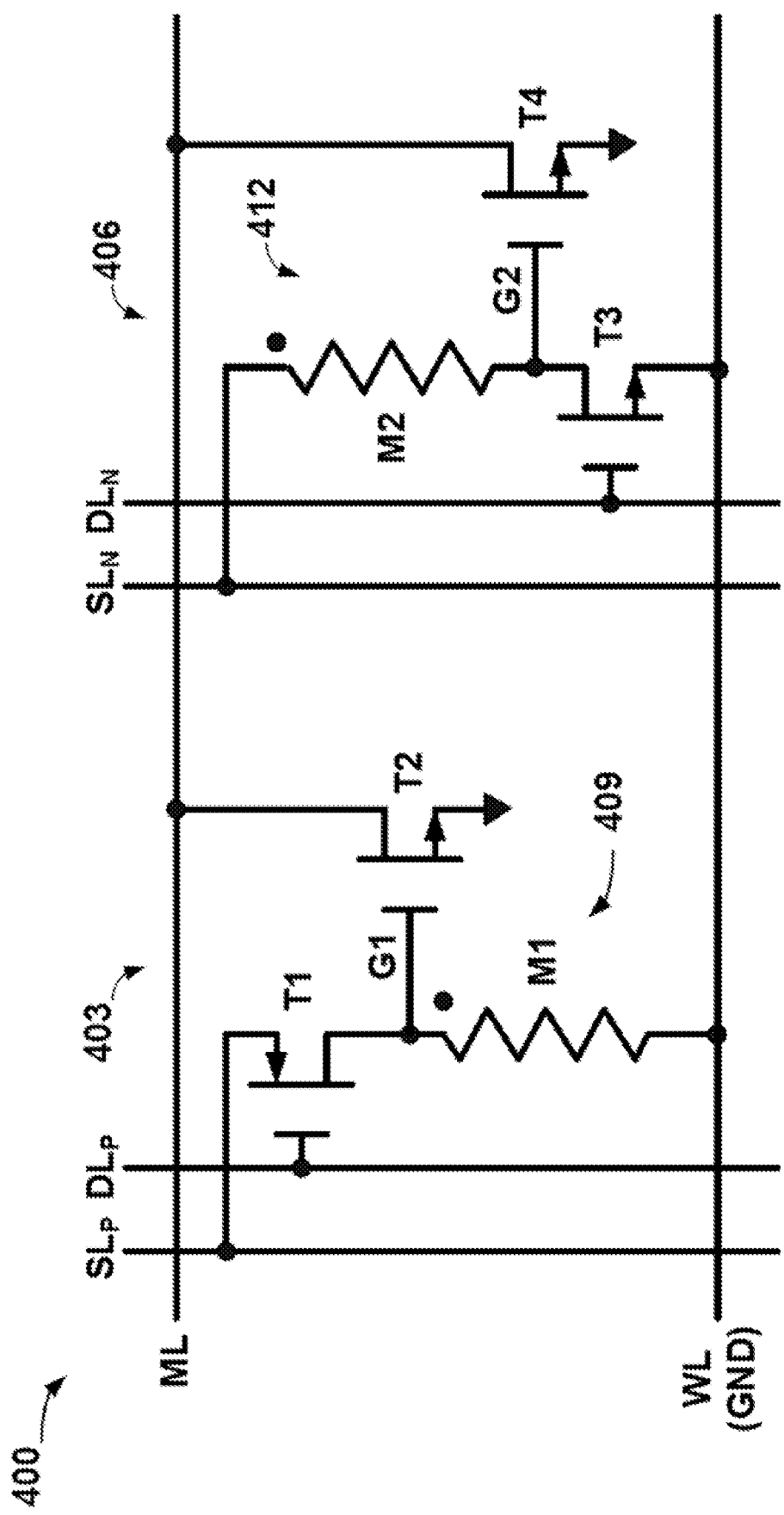
FIG. 4 depicts an electronic circuit implementing aCAM cell, in accordance with example embodiments described herein.

FIG. 4 depicts an electronic circuit implementing aCAM cell 400 that may be used to implement aCAM cells 205 of FIG. 2 in some examples. aCAM cell 400 includes "high side" 403 and "low side" 406. These may be relative values to each other, at least in part because the memristor (M1) and the memristor (M2) are programmed to determine the values of $R_{high}$ and $R_{low}$, respectively.

High side 403 includes a first transistor (T1) and a first memristor (M1). The first memristor (M1), in conjunction with the first transistor (T1), defines first voltage divider 409 for the voltage applied on SLP and, when programmed, the memristor (M1) defines a high value $R_{high}$ of a range of values $R_{range}$. The high side 403 also includes a second transistor that, in use, indicates whether a searched value matches the high value $R_{high}$ as discussed further below. Low side 406 includes a third transistor (T3) and the second memristor (M2). The second memristor (M2), in conjunction with the third transistor (T3), defines second voltage divider 412. When the second memristor (M2) is programmed, the memristor (M2) defines the low value $R_{low}$ of the range of values $R_{range}$. Low side 406 also includes a fourth transistor (T4) that, in use, indicates whether the searched value matches the low value $R_{low}$.

aCAM cell 400 also includes a match line (ML), a word line WL that serves as a ground, search lines $SL_P$, $SL_N$, and data lines $DL_P$, $DL_N$. As noted above, the memristor-transistor pairs M1/T1 and M2/T3 define respective voltage divider 409, 412. The memristors M1, M2 of voltage dividers 409, 412 are used encode $R_{high}$ and $R_{low}$ when the memristors M1, M2 are programmed. The searched data may match the stored data based on a function of the voltage divider (e.g., the M1/M2 values and the transistor characteristics). Thus, in this example, in each memristor-transistor pair M1/T1 and M2/T3, the analog search may be implemented as the gate voltage of the transistor to create a variable-resistor divider with the memristors programmed to analog (stored) values to represent an analog number or range.

In high side 403, where $R_{high}$ is programmed, $V_{search}$ on $DL_P$ should be low enough such that the voltage at G1 (created by the voltage divider between T1 and M1) does not turn on the T2 pulldown transistor. If $DL_P$ is too low (indicating a search value above the $R_{high}$ bound), then T1 is very low resistance, and thus the voltage at G1 will be similar to the search voltage on $SL_P$, and therefore quite high causing T2 to turn on and discharge the pre-charged voltage on the ML, indicating a mismatch.

In low side 406, where $R_{low}$ is programmed, $V_{search}$ on $DL_N$ should be high enough such that the voltage at G2 (created by the voltage divider between M2 and T3) is fairly low and does not turn on the pulldown transistor T4. If $DL_N$ is too low, then T3 can be too high resistance, and cause the voltage at $V_{SLn}$ and $V_{G2}$ to mismatch and discharge similar to as noted above. In other words, the voltage at G2 will be close to the SLn voltage in a particular case where DLn voltage is low. In this situation, the T3 transistor is very high resistance, particularly compared to the resistance of M2. Therefore, the voltage divider from M2 and T3 will result in the voltage at G2 (e.g., midpoint of the divider) to be close to the voltage at SLn (as T3 is significantly more resistance, a larger proportion of the total voltage SLn applied across M2 and T3 in series will drop across T3). This example uses an inverse mapping of the desired analog search value onto low and high gate voltages for T1 and T3 lines. So, for instance: $SL_P=SL_N=0.8V$, $DL_P=0V$, $DL_N=1.5V$, $M1=10\Omega$, and $M2=10\ k\Omega$.

Note that the transistors T1-T4 are implemented using metal-oxide semiconductor field-effect transistors ("MOSFETs"). T1 is a positive or "p" MOSFET and T3 is a negative or "n" MOSFET. This permits the two memristors M1, M2 to be more similar in resistance. This, in turn, offers potential for more analog levels relative to examples in which T1 and T3 are both "n" MOSFETs with the memristor/transistors pairs reversed. These and other advantages arising from the circuit design will become apparent to those skilled in the art having the benefit of this disclosure.

Various tuning knobs may be implemented in aCAM 400 for adjusting cell performance, including the voltages on $DL_P$, $DL_N$, $SL_P$, $SL_N$, and the number of levels/ranges of M1 and M2. The source as GND for T1 and T2 pulldown transistors can also be changed to a global non-zero voltage value to help tune cases of near-matches. Still other tuning knobs, or sources for adjustment, may become apparent to those skilled in the art having the benefit of this disclosure.

Figure 5:
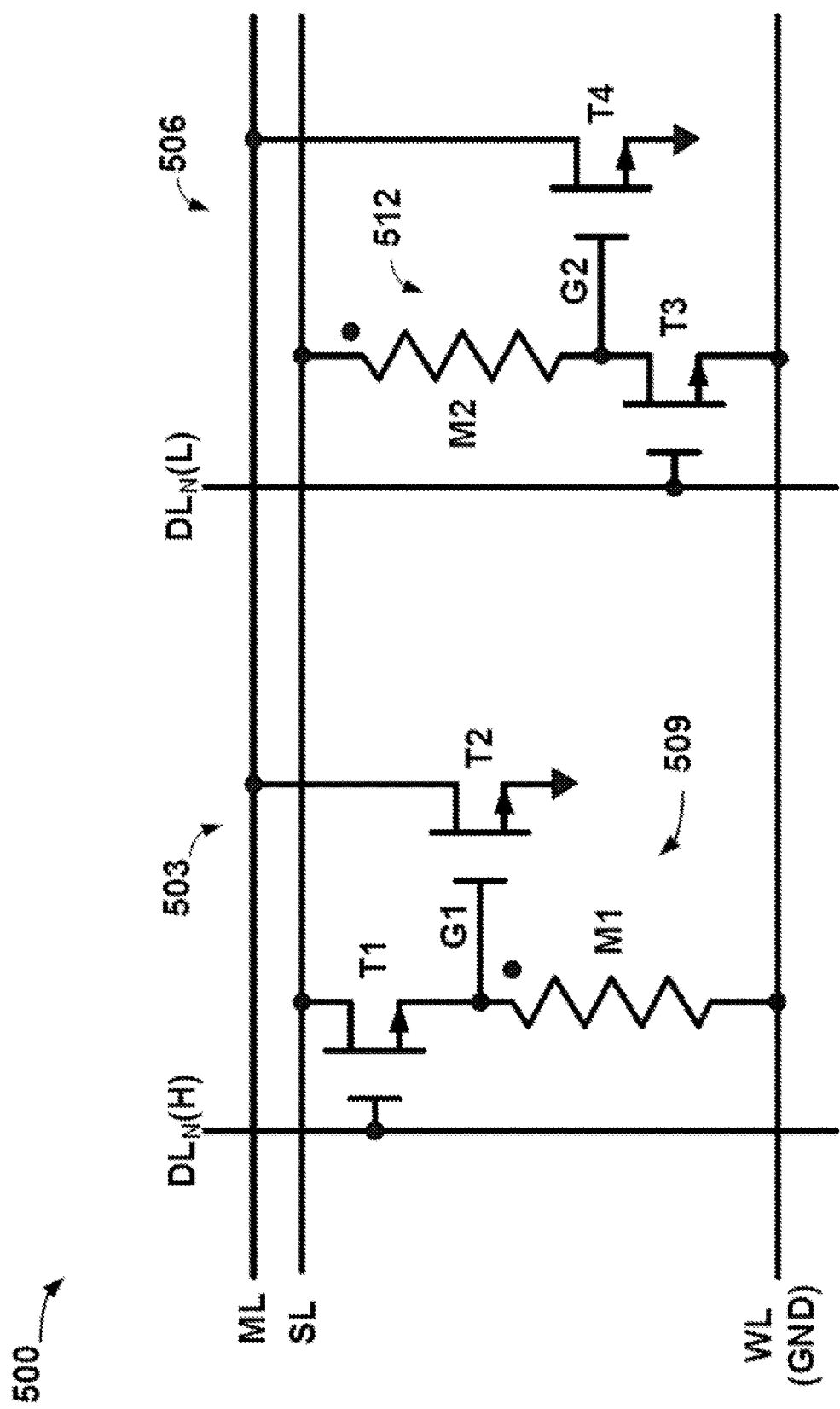
FIG. 5 depicts an electronic circuit implementing aCAM cell, in accordance with example embodiments described herein.

FIG. 5 depicts an electronic circuit implementing aCAM cell 500 that may be used to implement aCAM cells 205 of FIG. 2. aCAM cell 500 includes high side 503 and low side 506, at least in part because the memristor (M1) and the memristor (M2) are programmed to determine the values of $R_{high}$ and $R_{low}$, respectively.

High side 503 may include a first transistor (T1) and a first memristor (M1). The first memristor (M1), in conjunction with the first transistor (T1), defines first voltage divider 509 and, when M1 programmed accordingly, defines a high value $R_{high}$ of a range of values $R_{range}$. High side 503 also includes a second transistor that, in use, indicates whether a searched value matches the high value $R_{high}$ as discussed further herein.

Low side 506 includes a third transistor (T3) and the second memristor (M2). The second memristor (M2), in conjunction with the third transistor (T3), defines a second voltage divider 512. When the second memristor (M2) is programmed, the memristor (M2) defines the low value $R_{low}$ of the range of values $R_{range}$. Low side 506 also includes a fourth transistor (T4) that, in use, indicates whether the searched value matches the low value $R_{low}$.

aCAM cell 500 also includes a match line (ML), a word line (WL) that serves as a ground, a search line (SL), and data lines $DL_N(H)$, $DL_N(L)$. As noted herein, the memristor-transistor pairs M1/T1 and M2/T3 define respective voltage dividers 509, 512. Voltage dividers 509, 512 are used encode $R_{high}$ and $R_{low}$ when the memristors M1, M2 are programmed. Thus, in this example, in each memristor-transistor pair M1/T1 and M2/T3, the analog search is implemented by determining the gate voltage of the voltage-divider transistors to create a variable-resistor divider with the memristors programmed to an analog (stored) value.

In high side 503, where $R_{high}$ is programmed into M1, $V_{search}$ on data line $(DL)_N(H)$ may be low enough such that the voltage at G1 (e.g., created by the voltage divider between T1 and M1) does not turn on the T2 pulldown transistor. If data line $(DL)_N(H)$ is too high (e.g., indicating a search value above the $R_{high}$ bound), then T1 is very low resistance, and the voltage at G1 may be similar to the search voltage on search line (SL), causing a mismatch and discharge through T2.

In low side 506, where $R_{low}$ is programmed, $V_{search}$ on data line $DL_N(L)$ may be high enough such that the voltage at G2 (e.g., created by the voltage divider between M2 and T3) does not turn on the T4 pulldown transistor. If data line $DL_N(L)$ is too low, then T3 can be too high resistance, and cause the voltage at G2-search line (SL) search voltage, causing a mismatch and discharge through T4.

High side 503 and low side 506 may share search line (SL) but may have limited bit resolution with only "one" knob on voltage divider (e.g., data lines $DL_N(H)$ and $DL_N(L)$). In some examples, the search line (SL) may be separated into two search lines to control drain voltage independently on the two search sides (e.g., high side 503 and low side 506).

Figure 6:
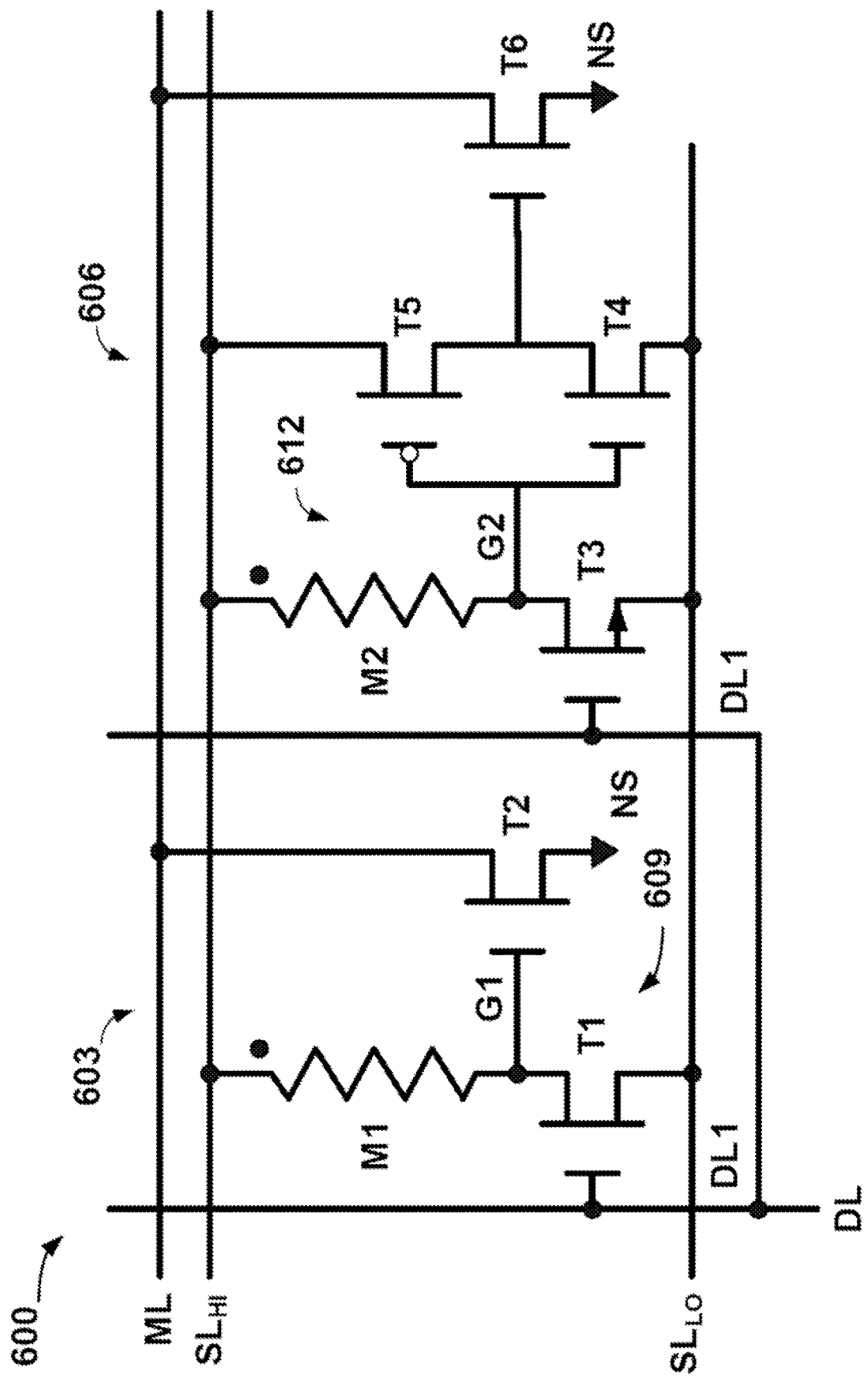
FIG. 6 depicts an electronic circuit implementing aCAM cell, in accordance with example embodiments described herein.

FIG. 6 depicts an electronic circuit implementing aCAM cell 600 that may be used to implement aCAM cells 205 of FIG. 2 in some examples. aCAM cell 600 includes high side 603 and low side 606, based at least on the memristor (M1) and the memristor (M2) being programmed to determine the values of $R_{high}$ and $R_{low}$, respectively.

High side 603 includes a first transistor (T1) and a first memristor (M1). The first memristor (M1), in conjunction with the first transistor (T1), defines first voltage divider 609 and, when programmed, defines a high value $R_{high}$ of a range of values $R_{range}$. High side 603 also includes a second transistor that, in use, indicates whether a searched value matches the high value $R_{high}$ as discussed further herein.

Low side 606 includes a third transistor (T3) and the second memristor (M2). The second memristor (M2), in conjunction with the third transistor (T3), defines second voltage divider 612. When the second memristor (M2) is programmed, the memristor (M2) defines the low value $R_{low}$ of the range of values $R_{range}$. Low side 606 also includes another transistor T6 that, in use, indicates whether the searched value matches the low value $R_{low}$.

Note that the example shown in FIG. 4 and described herein can use different encoding of the input voltage for $DL_P$ and $DL_N$ than does the example of FIG. 6. In the example of FIG. 6, the inputs can be tied together so that T1/M1 and T3/M2 are equivalent, and T4/T5 can form an inverter. Thus, the left side and right side may define the low side and the high side independently. The T4/T5 inverter is illustrated in low side 606 in the illustrated example, and may be implemented in high side 603 in other examples.

aCAM cell 600 also includes a match line (ML), search lines ($SL_{HI}$), ($SL_{LO}$) and data lines (DL), (DL1). As noted above, the memristor-transistor pairs M1/T1 and M2/T3 define respective voltage dividers 609, 612. Voltage dividers 609, 612 are used to encode $R_{high}$ and $R_{low}$ when the memristors M1, M2 are programmed. Thus, in this example, in each memristor-transistor pair M1/T1 and M2/T3, the analog search is implemented as the gate voltage of the transistor to create a variable-resistor divider with the memristors programmed to an analog (stored) value.

More particularly, first memristor (M1) and first transistor (T1) form voltage divider 609, in which M1 is a memristor with tunable non-volatile resistance and T1 is a transistor whose resistance increases with the input voltage on the data line (DL). Therefore, there exists a threshold voltage, dependent on the M1 resistance, that when the data line (DL) input voltage is smaller than the threshold, the pull-down transistor T2 turns on which pulls down the match line (ML) yielding a "mismatch" result. Similarity, memristor (M2) and transistor T3 form another voltage divider 612, and the internal voltage node is inverted by the transistors T4, T5 before applying to another pull-down transistor T6. As a result, with properly programmed resistances in the memristors M1, M2, aCAM cell 600 keeps the match line (ML) high when the voltage on the data line (DL) is within a certain range defined by M1 and M2 resistances.

Still referring to FIG. 6, the search result is therefore sensed as the voltage level on the match line (ML), which is pulled down when the gate voltage of the pull-down transistor T1, T3 exceeds its threshold voltage ($V_{th}$). In some examples, the voltage on G1 ($V_{G1}$) decreases with $V_{DL}$. Therefore, a lower bound voltage ($V_{lo}$) exists, which is configurable by the corresponding memristor conductance. When the $V_{DL}$ is smaller than $V_{lo}$, $V_{G1}$ is larger than the $V_{th}$ of the pull-down transistor, causing the match line (ML) to be pulled down for a "mismatch" result. Similarly, voltage on G2 ($V_{G2}$) increases with $V_{DL}$, and therefore the upper bound voltage is configured by another memristor conductance in the same aCAM cell 600.

The operation of the memristor aCAM cell 600 will now be discussed. The pre-charging of the match line (ML) is initiated by enabling a pre-charging peripheral not shown in FIG. 6. The data lines (DL) are asserted in conjunction with the match line (ML) pre-charge while $SL_{HI}$ is kept low.

The search may be started by asserting $SL_{HI}$. As an illustrative example, the search result sensed from the match line (ML) 10 ns after initiating the search can output a match when the voltage on the data line (DL) falls within a predefined range defined by the memristor conductances given by G(M1) and G(M2) where conductance is the inverse of resistance. The gate voltage $V_{G1}$ at G1 in FIG. 6 of the pull-down transistor T2 drops to a voltage below its threshold with increasing data line (DL) voltage. The gate voltage $V_{G2}$ at G2 in FIG. 6 of the pull-down transistor T6 increases to a voltage above its threshold with increasing data line (DL) voltage. The cut-off data line (DL) voltage for a lower and upper bound of a matched search increases with the corresponding memristor conductance.

The relationship between the search voltage range and the memristor conductance can be better understood by the voltage divider effect from the series connected transistors and memristors M1/T1 and M2/T3 in FIG. 6. During the operation, the transistors (T1), (T2) may be working in a triode regime as the voltage drop across the transistor channel may be fairly small. Under this condition, the match line may be pulled down (i.e. a mismatch) when the $V_{DL}$ follows the following equation:

$$V_{DL} \geq G_{M1} \cdot (V_{SLHi}/V_{TH,ML}-1)/\beta + V_{TH}$$

where $V_{TH}$ and $V_{TH}$,ML are the threshold voltages of the transistor in the voltage divider and the transistor which discharges or pulls down the ML respectively, and $\beta$ is a constant coefficient. $G_{M1}$ is the memristor conductance, which is linearly correlated to the search voltage range on the DL according to the equation.

Returning to FIG. 6, aCAM cell 600 will output a match result when:

$$f(G_{M1}) < V_{DL} < f(G_{M2}),$$

where $f(G_{M1})$, and $f(G_{M2})$ are the voltages at G1, G2, respectively, in FIG. 6.

If a cell has DL as the input and G1 as output, it is an inverter with a tunable parameter defined by M1 resistance.

$$V_{G1} = \frac{R_{NFET}}{R_{NFET} + R_{M1}} \cdot V_{SLhi} < V_{g,pulldown}$$

Assuming field-effect transistor (FET) is working in a triode mode:

$$V_{DL} - V_{THN} > (V_{SLhi}/V_{th}-1)/(\beta \cdot R_{M1}) \propto R_{M1}^{-1}$$

Assuming field-effect transistor (FET) is working in a saturation mode:

$$V_{DL} - V_{THN} > \sqrt{2(V_{SLhi} - V_{th})/(\alpha\beta \cdot R_{M1})} \propto R_{M1}^{-0.5}$$

Figure 7:
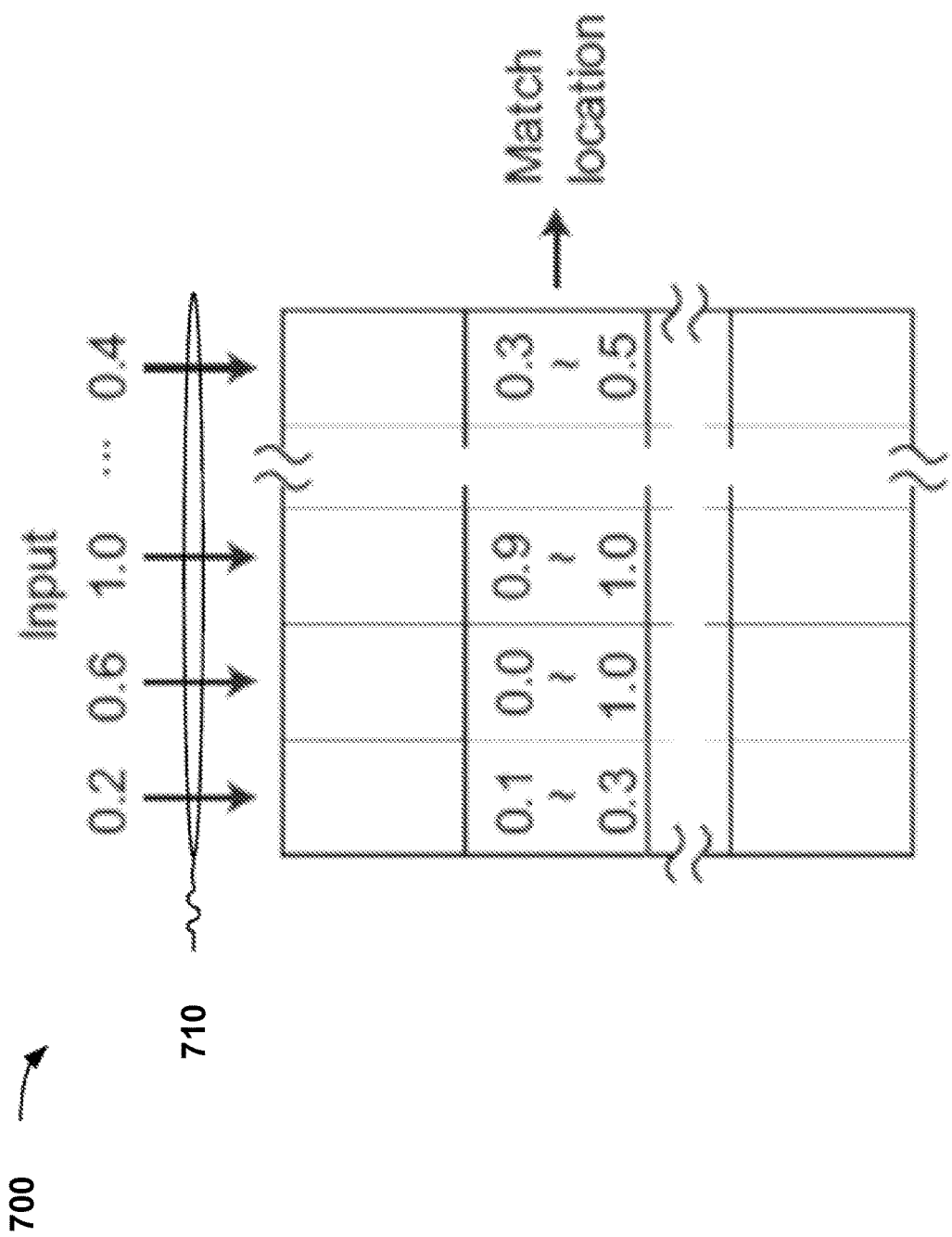
FIG. 7 depicts a search operation on an aCAM cell, in accordance with example embodiments described herein.

FIG. 7 depicts a search operation on an aCAM cell, in accordance with example embodiments described herein. In this illustration, search inputs are analog values instead of zeros and ones. Note that there may be no register for the search data. Since the values may be continuous, to avoid ambiguity, the stored value in aCAM 700 may represent a range instead of a specific value.

Similar to a digital CAM word, an aCAM word may return a "match" result when all input values fall within the ranges that are stored in analog memories, specifically for memristors, as resistance (or equivalently conductance) values for the word row of analog CAM cells. In some examples, aCAM 700 implements the TCAM-like function, where TCAM stores an equivalent range from zero to one, while the aCAM stores arbitrary sections in whole range of the analog signal. The wild-card, or "X" value, which matches all the inputs, can be stored when the resistances of the two memristor maps to the lower and upper bound of the input voltage range respectively.

In some examples, the analog search pattern is directly input to aCAM 700 over a plurality of inputs 710. In some examples, the analog search pattern may be input over inputs 710 into a search register (not shown). Although search registers are ordinarily used with digital binary values (e.g., FIG. 1), they may be implemented here in aCAM 700. However, search registers handling analog input values may be implemented using, for example, sample/hold circuits.

Some examples (not shown) may therefore may input analog search values over one or more search registers.

Figure 8:
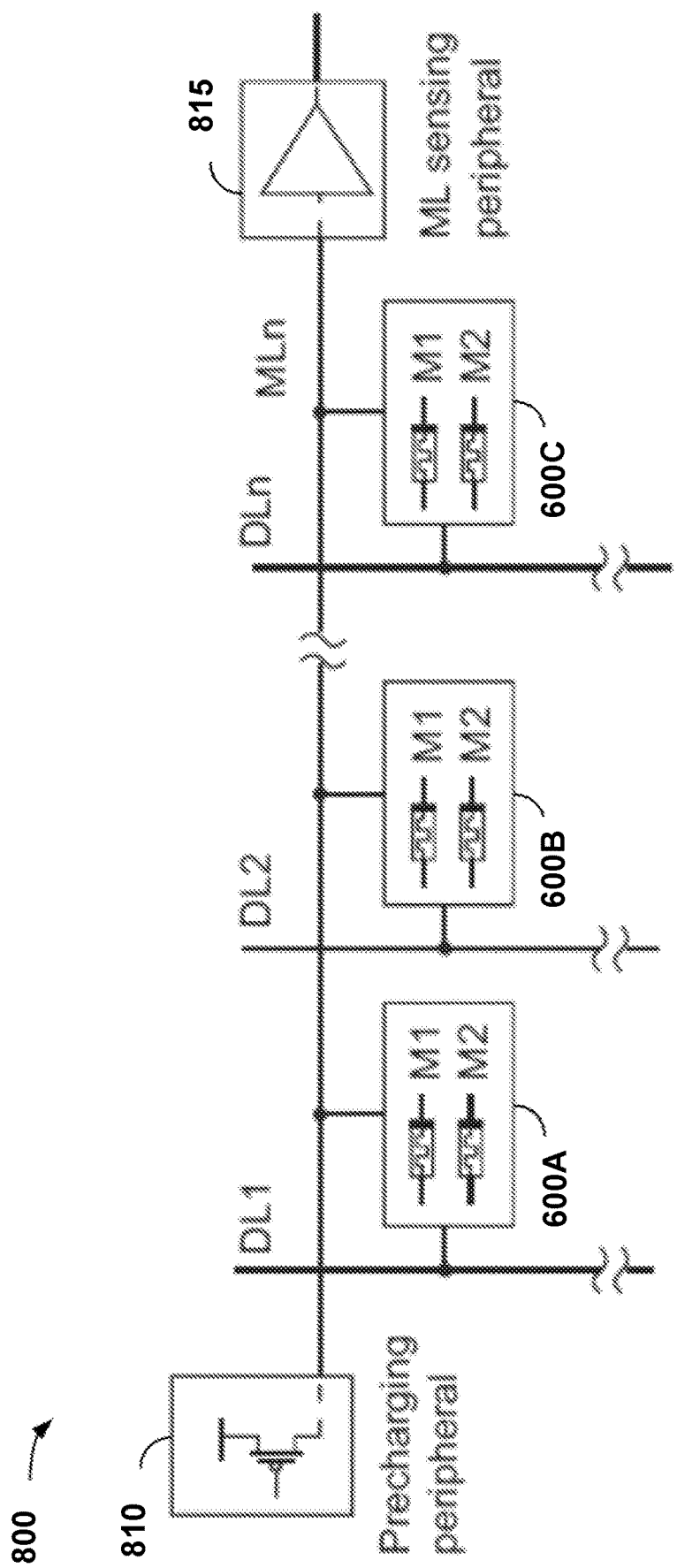
FIG. 8 shows a high-level implementation of the memristor-based aCAM, in accordance with example embodiments described herein.

FIG. 8 shows a high-level implementation of the memristor based aCAM 700 of FIG. 7 in accordance with one or more examples. In the example illustrated in FIG. 8, the aCAM cells are implemented using the electronic circuit of FIG. 6 (e.g., aCAM cells 600 are arranged in rows and columns as described herein, although only a single row 800 is shown in FIG. 8). The aCAM cells 600 (illustrated as first aCAM cell 600A, second aCAM cell 600B, third aCAM cell 600O) also includes data lines ($DL_1$-$DL_n$) and a match line (ML) for each row 800. aCAM includes pre-charging peripheral 810 that charges the match lines (MLs) in the enabled words to a high logic level prior to the search. A match line (ML) stays at the high logic level when all the inputs are within the ranges defined by the memristor resistances in each CAM cells 600. The matching results may be read out by sensing peripheral 815.

Each of the examples disclosed herein include at least two programmed memristors. The memristors M1, M2 in the aCAM cells 600 may be programmed before the search operation. As illustrated in FIG. 6, the data lines $DL_1$, $DL_2$ select the memristor device, M1 or M2, to be programmed, and the programming voltage is applied through the search lines $SL_{HI}$ and $SL_{LO}$ to set (i.e., program the device from a low conductance state to a high conductance state) or reset the device. An analog voltage can be applied to the data lines $DL_1$, $DL_2$ to set a compliance current during the set operation for a better multilevel tunability. In the case that the programmed memristor conductance needs to be verified after the write operation, the conductance of a given memristor may be read out by current while applying a reading voltage across $SL_{HI}$ and $SL_{LO}$, with data lines selects the device. TABLE 1 summarizes the detailed voltage signals as used in various operations.

TABLE 1

Write Operations of the Analog CAM Cell

| Operation | $SL_{HI}$ | $SL_{LO}$ | DL1 | DL2 |
|---|---|---|---|---|
| Set M1 | $V_{set}$ | 0 | $V_{g, set}$ | 0 |
| Reset M1 | 0 | $V_{reset}$ | $V_{DD}$ | 0 |
| Set M2 | $V_{set}$ | 0 | 0 | $V_{g, set}$ |
| Reset M2 | 0 | $V_{reset}$ | 0 | $V_{DD}$ |
| Read M1 | $V_{read}$ | 0 | $V_{DD}$ | 0 |
| Read M2 | $V_{read}$ | 0 | 0 | $V_{DD}$ |

The aCAM disclosed herein may permit ternary-like operations. For example, the aCAM cells can store and operate on, as discussed herein, a range of values. In a large fraction of TCAM encoding of desired data to be stored and matched, "X" values may be typically implemented from the right (less significant bits) to the left (more significant bits). The "don't care" values may not be randomly distributed throughout an 8-bit/16-bit object. So, for instance, in a four-bit object Xs as 1001, 100X, 10XX, 1XXX-1X1X may not be implemented.

For instance, assume two-bit objects, which would use four levels of memristor resistance or conductance state— 00, 01, 10, 11. TABLE 2 sets forth possible compressions using the aCAM cells discussed herein. Note that X1 and X0 are not eligible for compression in this technique.

TABLE 2

Compression with Two-Bit Objects

| Stored Value | Matches |
|---|---|
| 0X | 00, 01 |
| 1X | 10, 11 |
| XX | 00, 01, 10, 11 |

The data compression ratio may be matched to stored data attributes. For example, to compress in four-bit objects, a four-level aCAM cell may be used. The number of stored analog bits per cell may be based on compression requirements and spacing of "X" bits, or "don't care" bits. As the same circuit can be used to encode four levels, eight levels, etc., this could be done dynamically.

For another instance, assume four-bit objects, yielding sixteen levels of memristor state. Introducing "X" bits, or "don't care" bits from the right-hand side, three Xs may be introduced for the three right-most bits. TABLE 3 sets forth possible compressions using the aCAM cells of the present disclosure. Note that X000 to X111 may not be eligible for compression in this technique.

TABLE 3

Compression with Four-Bit Objects

| Stored Value | Matches |
|---|---|
| 000X | 0000, 0001 |
| 001X | 0010, 0011 |
| 010X | 0100, 0101 |
| 011X | 0110, 0111 |
| 100X | 1000, 1001 |
| 101X | 1010, 1011 |
| 110X | 1100, 1101 |
| 111X | 1110, 1111 |
| 00XX | 0000 to 0011 |
| 01XX | 0100 to 0111 |
| 10XX | 1000 to 1011 |
| 11XX | 1100 to 1111 |
| 0XXX | 0000 to 0111 |
| 1XXX | 1000 to 1111 |

As described above, when "X" bits are implemented from less significant bits to more significant bits, the TCAM is matching a continuous input range. For example, 10XX represents a matching from 1000-1011 (or 8-11 in decimal number), which can be represented by one 4-bit equivalent analog CAM cell. On the other hand, the analog CAM also permits the search in an arbitrary range in the 4-binary-bit space, and some of the ranges cannot be represented by one TCAM word (e.g. 0010-1110 or 2-14 in decimal number).

Note that the discussion associated with TABLE 2 and TABLE 3 discusses the functionality of the aCAM in terms of binary values. For example, the aCAM disclosed herein can perform in the manner of known, digital TCAMs. However, as should be apparent from the disclosure herein, the aCAM can also store and operate on analog values with which compression would operate in an analogous manner to that discussed relative to TABLE 2 and TABLE 3.

Each of the examples of an aCAM memory cell in FIGS. 4-6 can include a high side and a low side in which the high bound and the low bound, respectively, of the range of values is set. Each of the high sides and low sides includes a first voltage divider and a second voltage divider, respectively. In each of these voltage dividers, T1 and T3 are variable resistances and M1 and M2 are programmable resistances. The variable resistor (T1, T3) is controlled electronically through the search line or data line voltage.

For instance, the programmable resistor may be a metal oxide memristor device, as is the case in the illustrated examples. Other examples may instead use a phase-change memory ("PCM") device, a spin torque transfer ("STT") device, a ferroelectric random access memory ("FeRAM") device, or other resistive memory devices with a programmable resistance. The variable resistor in the illustrated examples is a complementary metal oxide semiconductor ("CMOS") transistor. Other examples may instead use a ferroelectric transistor or other three-terminal electronic non-linear device (i.e., device resistance changes with applied voltage).

Furthermore, the examples discussed herein present only illustrative means by which the high bound and low bound for the range of values in an aCAM memory cell. Those in the art having the benefit of this disclosure may appreciate other means by which this setting of the bounds may be accomplished. Accordingly, the subject matter claimed below encompasses means substantially equivalent to those expressly disclosed herein that perform this function.

Throughout this disclosure, the term "match" is used to describe a context in which a stored content "matches" a search-for portion of an input pattern. What constitutes a "match" will be implementation specific. So, for instance, in an operation with a digital, binary input, a "match" will be where the stored content is the same as the search-for input portion or is a "don't care" bit. In an operation with an analog input, a "match" will be where the searched-for input is within the range of values defined by the "high" value and the "low value" as described above or where a "don't care" bit. In the disclosed examples, a match may be defined as the ML voltage maintaining its pre-charged (high value), as well as a pattern match between searched and stored data.

The aCAM disclosed herein can increase memory density significantly relative to SRAM CAMs, as one aCAM cell searches and stores multibit signals with only six transistors while a SRAM CAM cell searches single-bit signals with 16 transistors. Since the energy consumption in the search operation of a CAM is mostly charging the parasitic capacitors, the reduced chip area leads to a significant drop in energy cost for completing a certain task. The analog processing capability also opens up the possibility of directly handling analog signals acquired from Internet of Things, such as sensors. The output of the aCAM is digital, which can be processed directly in digital logic, removing the cost of the expensive analog-digital conversion entirely. Furthermore, the function of the aCAM is intrinsically different from the digital CAMs, which may enable new applications for fuzzy logic, analog computing, probabilistic computing, and more.

According to example embodiments, any of the aCAM structures disclosed in co-pending and commonly-owned U.S. application Ser. Nos. 16/274,379, 16/744,136, or 16/526,455 may be incorporated by reference for any purpose and employed herein.

Using the aCAM structures discussed herein, various programming may be implemented (e.g., encoding, lookup, searching, storing, etc.).

Figure 9:
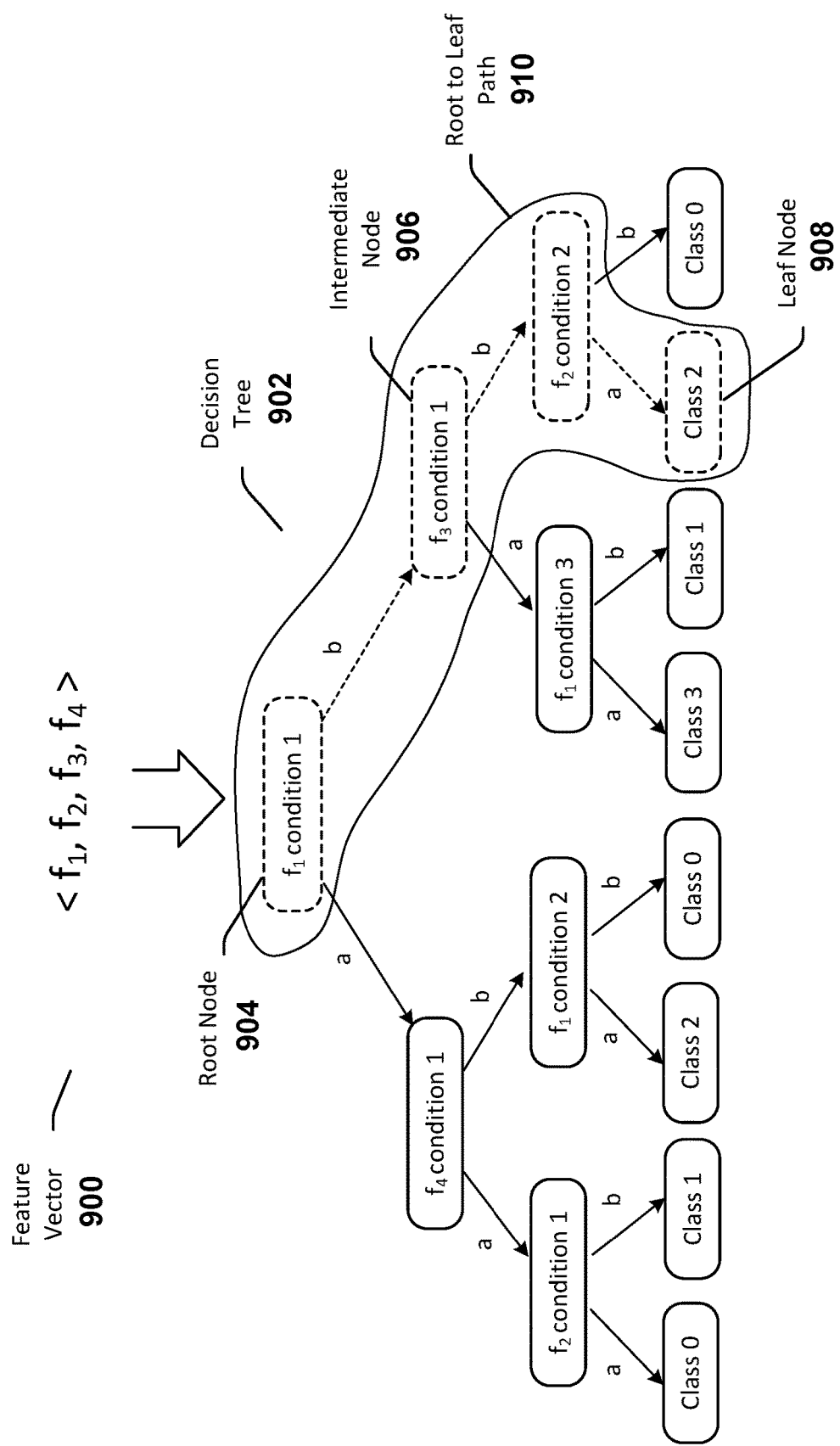
FIG. 9 illustrates a data structure for encoding values with an aCAM, in accordance with example embodiments described herein.

FIG. 9 is a flow diagram depicting conversion of a first data structure representing a set of logical rules to a second data structure representing the logical rules and encoding of values of the second data structure in an aCAM according to example embodiments of the invention. In example embodiments, the first data structure may be decision tree 902. Decision tree 902 may include a set of decision nodes including root node 904, various intermediate nodes (e.g., intermediate node 906), and various leaf nodes (e.g., leaf node 908) that represent terminus points of decision tree 902. It should be appreciated that decision tree 902 is merely an illustrative implementation of a data structure and other data structures are contemplated including, without limitation, arrays, lists, hash-based structures, graphs, and so forth.

Decision tree 902 may include multiple root-to-leaf paths. Each root-to-leaf path represents a traversal of a series of nodes in decision tree 902 beginning at root node 904, passing through various intermediate nodes, and ending at a given leaf node. In example embodiments, each decision node traversed in a given root-to-leaf path represents a respective evaluable condition involving a corresponding feature of feature vector 900. As such, each root-to-leaf path represents a series of evaluable conditions representative of a logical rule against which an input feature vector can be evaluated.

In the example root-to-leaf path 910 shown in FIG. 9, the series of evaluable conditions may begin with the condition evaluated at root node 904, which is illustratively depicted as involving feature $f_1$ of feature vector 900. In the example decision tree 902, evaluating the condition represented by any given decision node may result in one of two possible outcomes, labeled as outcome "a" and outcome "b." In some example embodiments, outcome "b" represents the condition not being satisfied when evaluated and outcome "a" represents the condition being satisfied when evaluated. For instance, if the evaluable condition at the root node 904 is whether $f_1$ is less than a value $x_1$, outcome "b" may represent a negative determination (i.e., $f_1 \geq x_1$) and outcome "a" may represent a positive determination (i.e., $f_1 < x_1$). It should be appreciated that in other implementations more than two outcomes may be possible for an evaluable condition associated with a node.

In the example root-to-leaf path 910, the outcome of the determination at the root node 904 is illustratively depicted as outcome "b," which indicates that the condition evaluated at the root node 904 involving feature $f_1$ is not satisfied. Based on this outcome, the root-to-leaf path 910 transitions from root node 904 to intermediate node 906. Transitions from a first node to a second node within a given root-to-leaf path are represented as a combination of the condition evaluated at the first node and the outcome of that evaluation. For instance, the transition from root node 904 to intermediate node 906 in the example root-to-leaf path 910 is represented as $f_1$ condition 1b. Using this convention, the example root-to-leaf path 910 can be represented by the following node transitions: $f_1$ condition 1b→$f_3$ condition 1b→$f_2$ condition 2a→Class 2. Each other root-to-leaf path in decision tree 902 may be similarly represented as a series of node transitions indicative of the condition evaluated at each node in combination with the outcome of that evaluation.

Figure 10:
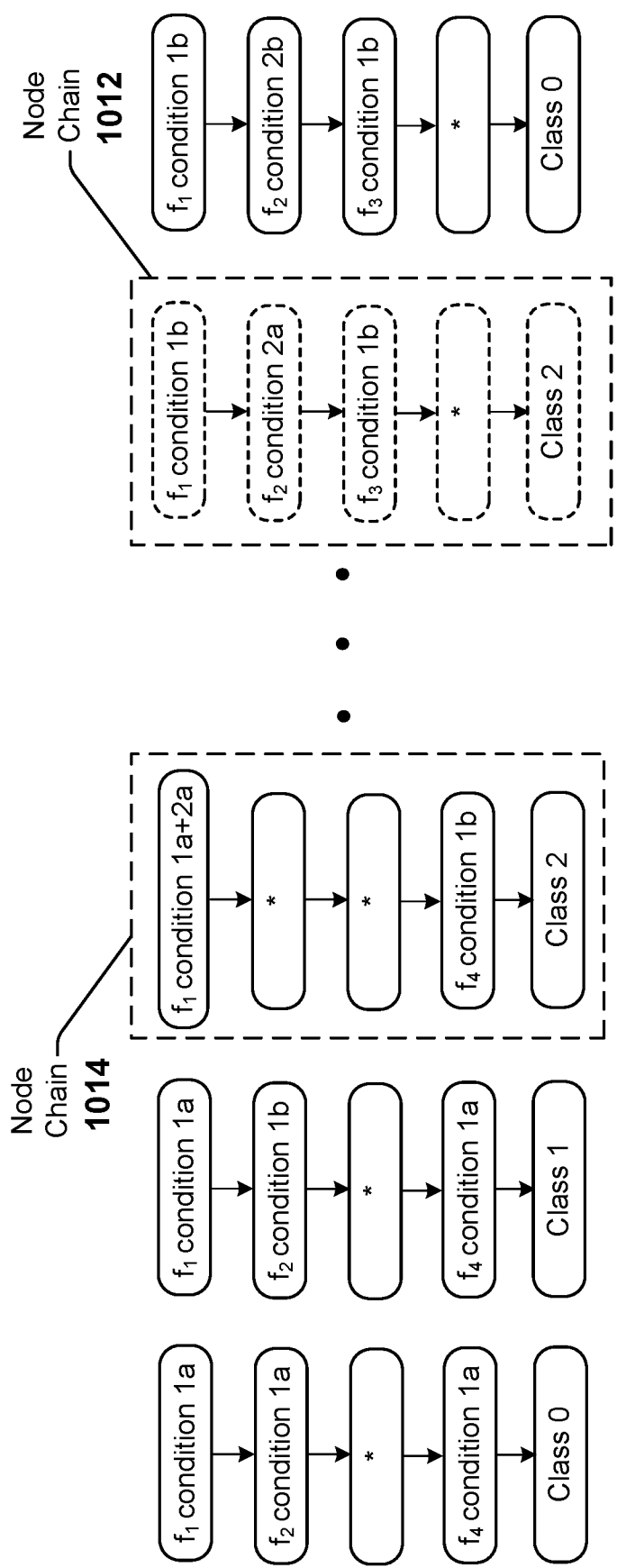
FIG. 10 illustrates a data structure for encoding values with an aCAM, in accordance with example embodiments described herein.

In example embodiments, the information contained in decision tree 902 may be converted to an alternate representation such as a tabular representation. In particular, each root-to-leaf path in decision tree 902 may be represented as a corresponding column in the tabular representation, referred to herein as a "node chain" and illustrated in FIG. 10.

For instance, the example root-to-leaf path 910 illustrated in FIG. 9 may be converted to node chain 1012. Each node in node chain 1012 may correspond to one or more node transitions in the corresponding root-to-leaf path 910. More specifically, each node in the node chain 1012 corresponds to a respective feature in feature vector 900. Because feature vector 900 is illustratively depicted as including four features ($f_1$, $f_2$, $f_3$, $f_4$), each node chain may include four nodes corresponding to the four features, as well as a node representing the leaf node of the corresponding root-to-leaf path. It should be appreciated that feature vector 900 may contain any number of features, in which case, corresponding node chains may include a corresponding number of nodes along with a leaf node. In some example embodiments, the leaf nodes may also correspond to a feature (e.g., an optimized parameter) that forms part of feature vector 900.

In example embodiments, certain root-to-leaf paths may not include evaluable conditions for one or more features. For instance, the root-to-leaf path 910 does not include an evaluable condition for feature $f_4$. For any such feature that does not have at least one associated evaluable condition in a root-to-leaf path, a "don't care" value may be used for the node that corresponds to that feature in the node chain that represents that root-to-leaf path. For instance, for root-to-leaf path 910, a "don't care" value is used for the node in node chain 1012 that corresponds to feature $f_4$. This means that any value specified for feature $f_4$ in a search query would result in a match with respect to feature $f_4$ when evaluated against node chain 1012 after it has been encoded in an aCAM.

In addition, in connection with converting the representation of the set of domain logic rules from decision tree 902 to the tabular representation, nodes within a given root-to-leaf path may be consolidated and/or reordered when determining the sequence of corresponding nodes in the node chain that represents the root-to-leaf path. For instance, an evaluable condition involving feature $f_3$ occurs before an evaluable condition involving feature $f_2$ in the sequence of nodes traversed as part of root-to-leaf path 910. However, prior to encoding node chain 1012 in an aCAM, the sequence of evaluable conditions represented by root-to-leaf path 910 may be reordered to ensure that the sequence of the evaluable conditions in the corresponding node chain 1012 matches the sequence of features in feature vector 900. This reordering may occur, as needed, for each root-to-leaf path in decision tree 902 as part of converting the root-to-leaf path to a corresponding node chain in the tabular representation.

More specifically, each node chain in the tabular representation (e.g., each column in a table) may begin with a node representing an evaluable condition involving feature $f_1$ in the corresponding root-to-leaf path, followed by an evaluable condition involving feature $f_2$, and so on until the penultimate node in the node chain is an evaluable condition involving the last feature fa in feature vector (e.g., feature $f_4$ in feature vector 900), with the final node being the appropriate leaf node (alternatively each leaf node may correspond to a last feature $f_n$ in feature vector).

In some examples, if a given root-to-leaf path does not include an evaluable condition for a particular feature, then the "don't care" value may be associated with a corresponding node in the node chain. This can ensure that each node chain in the tabular representation includes a same number of nodes regardless of which features are evaluated in the corresponding root-to-leaf path. Thus, the node transition for the example root-to-leaf path 910 (e.g., $f_1$ condition 1b→$f_3$ condition 1b→$f_2$ condition 2a→Class 2) may be reordered when represented as node chain 1012 to place the node for $f_2$ condition 2a before the node for $f_3$ condition 1b. In addition, because the root-to-leaf path 1010 does not include an evaluable condition involving feature $f_4$, a "don't care" value may be used for the node in node chain 1012 that corresponds to feature $f_4$. The sequence of nodes in node chain 1012 may then become: $f_1$ condition 1b→$f_2$ condition 2a→$f_3$ condition 1b→*→Class 2.

In some example embodiments, converting a root-to-leaf path to a corresponding node chain may include consolidating two or more node transitions in the path into a single node in the node chain. For example, consider the root-to-leaf path in decision tree 902 that includes the following node transitions: $f_1$ condition 1a→$f_4$ condition 1 b→$f_1$ condition 2a→Class 2. Two node transitions in this example path occur as a result of evaluating conditions involving feature $f_1$. As such, these two node transitions may be consolidated into the single node associated with feature $f_1$ in the corresponding node chain 1014 (represented as $f_1$ condition 1a+2a). For example, if $f_1$ condition 1a represents $f_1 > x_1$ and if $f_1$ condition 2a represents $f_1 < x_2$, the consolidated result (i.e., $x_1 < f_1 < x_2$) may be represented in the first node of node chain 1014 (e.g., the node associated with the feature $f_1$). Consolidating multiple node transitions involving a particular feature variable into a single consolidated node for that feature variable may increase the memory density and reduce the amount of area needed when encoding the set of logical rules represented by decision tree 904 into an aCAM.

The conversion of the example root-to-leaf path involving the sequence of node transitions identified above to node chain 1014 involves all of the types of data manipulations described above, specifically, consolidating node transitions (combining $f_1$ condition 1 a and $f_1$ condition 2a); reordering node transitions (moving $f_4$ condition 1b to a position in the node chain 1014 that is after the nodes corresponding to features $f_1$, $f_2$, and $f_3$); and inserting "don't care" values for particular nodes in the node chain 1014 that do not have evaluable conditions in the corresponding root-to-leaf path ("don't care" values for features $f_2$ and $f_3$). After performing each of these manipulations, node chain 1014 results in the following sequence of nodes: $f_1$ condition 1a+2a→*→*→$f_4$ condition 1 b→Class 2. In example embodiments, the set of all root-to-leaf paths represented in decision tree 902 may be converted to a corresponding set of node chains according to the methodology described above.

Figure 11:
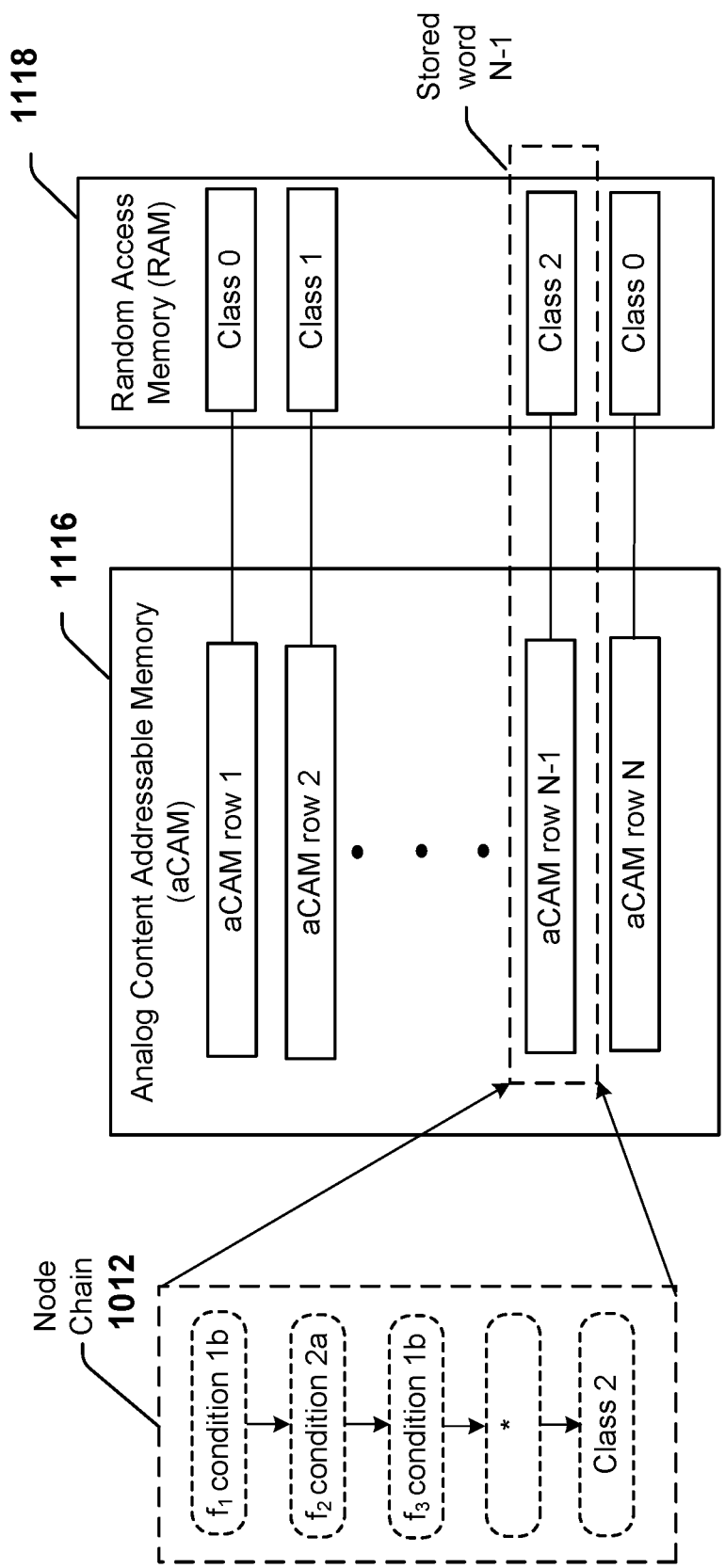
FIG. 11 illustrates a data structure for encoding values with an aCAM, in accordance with example embodiments described herein.

Once the conversion process is complete and the tabular representation of the domain logic rules is generated, each node chain in the tabular representation may be rotated and mapped to a respective row of aCAM 1116 in FIG. 11. In some example embodiments, the sequence of node chains in the tabular representation may be dictated by a convention that defines an order in which decision tree 902 is traversed to cover all root-to-leaf paths represented in decision tree 902. Further, in some example embodiments, the sequence of node chains in the tabular representation may be mapped and encoded to rows of aCAM 1116 in the same sequence. In other example embodiments, the sequencing of the node chains may not be relevant as long as each root-to-leaf node in decision tree 902 is converted to a respective corresponding node chain, and each node chain is mapped to and encoded in a respective row of aCAM 1116.

As shown in FIG. 11, node chain 1012 may be mapped to and encoded in a particular row of aCAM 1116 (e.g., aCAM row N–1). More specifically, each value represented in each node of node chain 1012 may be stored using a respective corresponding one or more cells of aCAM 1116 in row N–1. Each other node chain such as, for example, node chain 1014 may be similarly mapped to and encoded in a respective row of aCAM 1116 (not illustrated).

In some example embodiments, the value represented in a node of node chain 1012 may in fact be a range of values. As previously noted, aCAM 1116 provides the capability to store and encode such ranges of values. The number of aCAM cells required to encode the values/ranges of values corresponding to a particular feature (e.g., feature $f_1$) across all node chains (i.e., the number of aCAM cell columns corresponding to feature $f_1$) may depend on the level of precision required to encode such values/ranges of values. For a feature in feature vector 900 that is a categorical variable that can take on only a limited number of discrete values (e.g., the set of all origin or destination airports), a single column of aCAM cells may be sufficient to represent all stored values for that feature across the set of domain logic rules. On the other hand, for a feature that corresponds to a numeric variable capable of taking on a large number of possible values (e.g., a continuous range of values), multiple columns of aCAM cells may be required to provide the bit precision needed to store such values.

In some example embodiments, an output parameter of each node chain (domain logic rule) encoded in aCAM 1116 may in fact be stored in a memory array separate from aCAM 1116. For instance, as illustratively shown in FIG. 9, each of the leaf nodes of decision tree 902 represent classification outputs that may be stored in a random access memory (RAM) 1118 separate from aCAM 1116. This may then allow for multiple matches to be returned for a search query. In example embodiments, a search query may conform to the format of feature vector 900 and may specify a discrete value, a range of values, or a "don't care" value for each search variable (i.e., each feature in feature vector 900). The search query may then be searched, in parallel, against each row in the aCAM to determine if the search query matches the stored values in any such row. Each row of aCAM 1116 may represent a stored word that corresponds to a particular node chain, and thus, a particular root-to-leaf path in decision tree 902. In some example embodiments, a stored word may include only those values stored in a particular row of aCAM 1116. In other example embodiments, a stored word may include the values of a particular aCAM row as well as a corresponding value of the output parameter (e.g., the classification output value) stored in RAM 1118.

In some example embodiments, the output parameter (e.g., the classification outputs represented by the leaf nodes of decision tree 902) may be a parameter that a user seeks to optimize. For example, a search query may specify a maximum or minimum allowable value for the optimized parameter, in which case, any row in aCAM 1116 that matches each of the constrained and/or flexible parameter values specified in the search query and that satisfies the value specified for the optimized parameter may be returned as a match result. More specifically, the address of any such matching row in aCAM 1116 may be returned as a search result. Optionally, the corresponding value for the optimized parameter stored in RAM 1118 (or the memory address in RAM 1118 for the corresponding value) may also be returned.

In other example embodiments, rather than searching for stored rows in aCAM 1116 that correspond to output parameter values that are below or above a specified value as part of an optimization process, a search query may instead specify a value for the output parameter that requires an exact match among the values for the output parameter stored in RAM 118. For instance, in such example embodiments, a search query may result in a match only if (1) all other search parameter values specified in the search query match corresponding stored values in a given row of aCAM 1116 and (2) the output parameter value specified in the search query exactly matches a value stored in RAM 1118 that corresponds to that row in aCAM 1116. Thus, in such example embodiments, a search query that includes search variable values that satisfy the first four nodes of node chain 1012, but that specifies "Class 3" for the output parameter value would not produce a match at stored word N-1.

In still other example embodiments, a search query may specify an exclusionary value for the output parameter. For instance, the search query may specify "Class 2" as an exclusionary value for the output parameter in FIG. 9. Such an example search query would then produce a matching result for any row in aCAM 1116, and thus, any node chain in the tabular representation and corresponding root-to-leaf path in decision tree 902, that matches each of the other constrained parameters in the search query and that corresponds to a stored output parameter value other than "Class 2." This may represent a mechanism for optimizing the output parameter by specifying values to be excluded from matching rather than through iterative adjustment of the optimized parameter.

Figure 12:
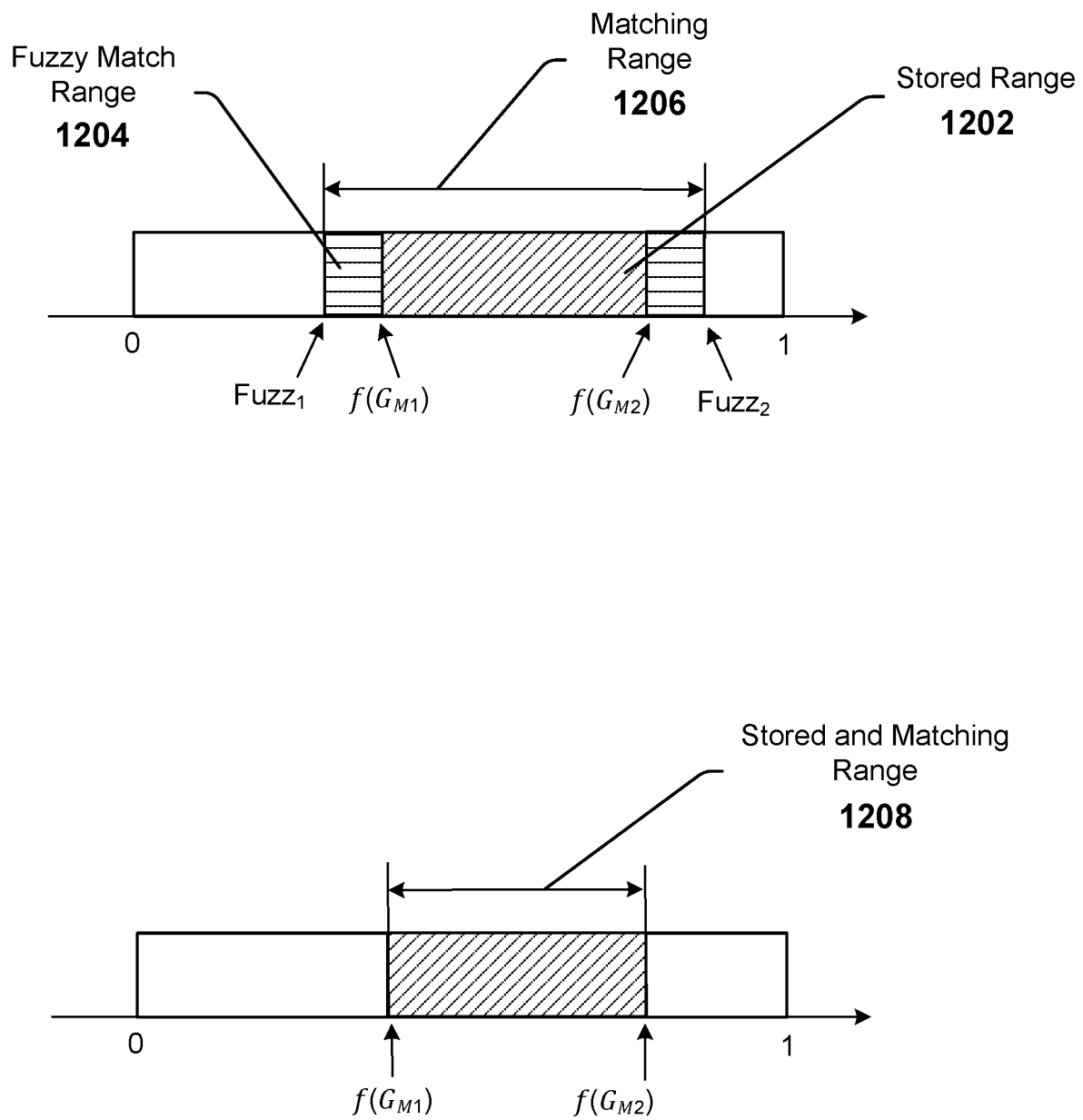
FIG. 12 illustrates target analog voltage range, in accordance with example embodiments described herein.

FIG. 12 illustrates a target analog voltage range, in accordance with example embodiments described herein. As illustrated, the aCAM cell may store an analog range of values by tuning the respective conductances $G_{M1}$ and $G_{M2}$ of memristors M1 and M2 to obtain an analog voltage range defined by a lower voltage bound $f(G_{M1})$ and an upper voltage bound $f(G_{M2})$.

In some examples, the aCAM cell may search an input value (e.g., a discrete numeric value) against the analog range of values 1208 stored in the aCAM cell. This, in turn, involves determining whether a data line voltage $V_{DL}$ corresponding to the search input value is within an analog voltage range defined by a lower voltage bound $f(G_{M1})$ and an upper voltage bound $f(G_{M2})$ based on whether a match line to which the aCAM cell is connected remains at a high voltage (a high logic level) or is discharged to a low voltage (a low logic level). The stored range of values may be the same as the matching range of values.

In some examples, a fuzzy search is supported. In these examples, the aCAM cell may search an input range of values against a stored range of values and output a match even if the search input range does not strictly correspond to the stored range. As previously described, an aCAM cell may store an analog range of values 1202 by tuning the respective conductances $G_{M1}$ and $G_{M2}$ of memristors M1 and M2 to obtain an analog voltage range defined by a lower voltage bound $f(G_{M1})$ and an upper voltage bound $f(G_{M2})$. The aCAM cell may additionally provide a fuzzy search capability that expands a matching range 1206 for the aCAM cell beyond the stored range 1202 to include a fuzzy match range 1204 as well. In this manner, even if an input search range of values does not exactly fall within the stored analog range 1202, the aCAM cell may nonetheless output a match as long as the input search range falls within the larger matching range that also includes the fuzzy match range 1204. Fuzzy match range 1204 may be appended to one or both ends of stored range 1202 to produce matching range 1206. In example embodiments, fuzzy match range 1204 may be captured by the lower voltage bound $f(G_{M1})$ and the upper voltage bound $f(G_{M2})$ of the analog voltage range.

As an illustrative example, the range or range matching may be applicable for avoiding competing concurrent writes to overlapping regions in connection with updates to fabric-attached memory. For example, if regions of active development are tracked, incoming requests can be checked against the outstanding requests and if a range is found between a new request and an outstanding request, the new request can be queued until the outstanding request completes. It should be appreciated that the above example application scenario for range searching and matching is merely illustrative and not exhaustive.

Figure 13:
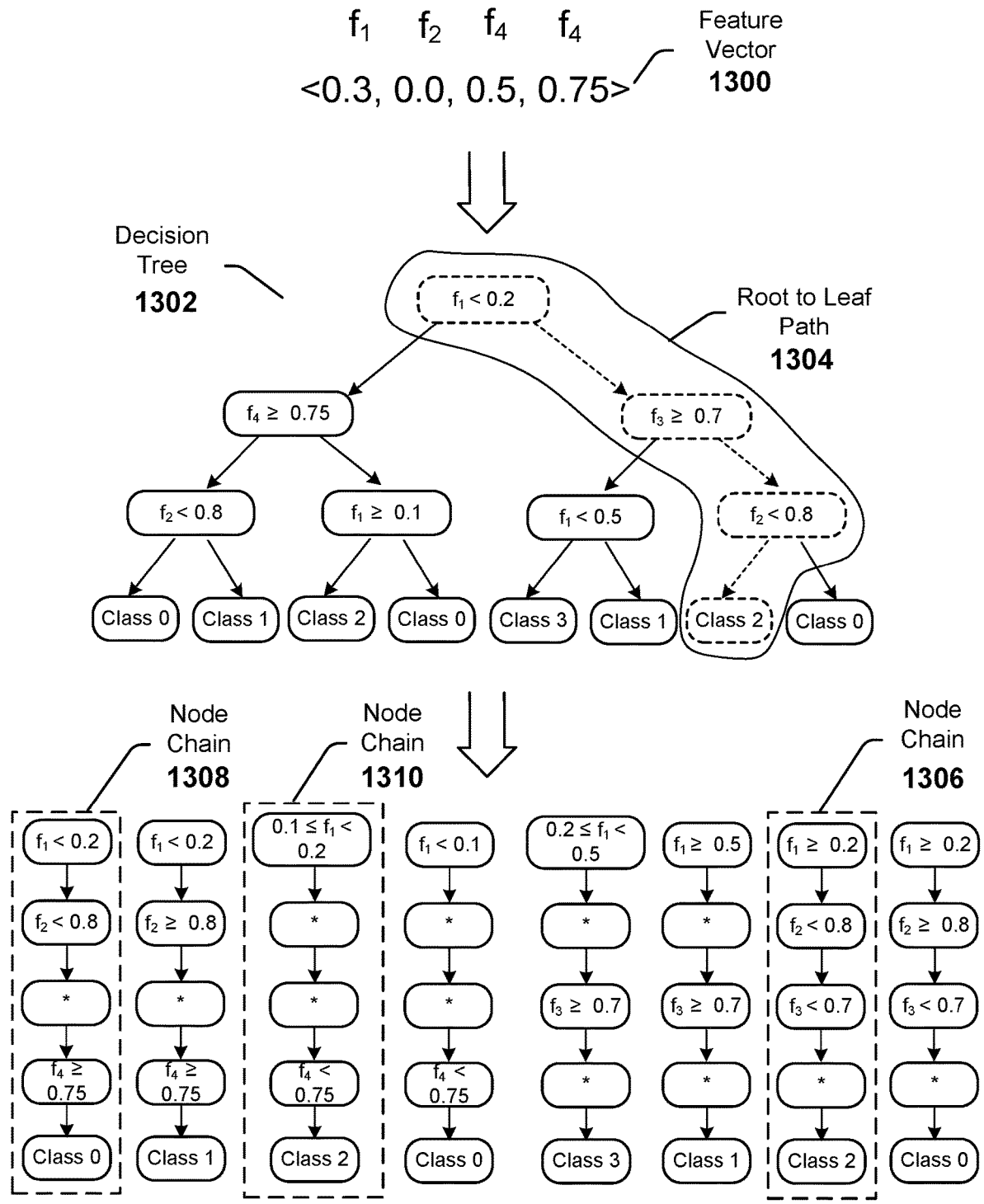
FIG. 13 illustrates a flow diagram depicting conversion of a decision tree to a tabular structure, in accordance with example embodiments described herein.

FIG. 13 illustrates a flow diagram depicting conversion of a decision tree to a tabular structure, in accordance with example embodiments described herein. In this illustration, the flow may depict a conversion of an example decision tree 1302 including a set of decision nodes that correspond to evaluable conditions representative of a set of logical rules to a tabular structure in which each logical rule is represented as a node chain in the tabular structure according to example embodiments of the invention. Decision tree 1302 may correspond with one example implementation of decision tree 902 in FIG. 9. Similarly, the feature vector 1300 may correspond with one specific example of the generalized feature vector 900 in FIG. 9.

Feature vector 1300 may represent a search query that specifies the values 0.3, 0.0, 0.5, and 0.75 for the search variables $f_1$, $f_2$, $f_3$, and $f_4$, respectively. In other example embodiments, the values 0.3, 0.0, 0.5, and 0.75 may represent input voltages, each of which maps to a specific search input value. In such example embodiments, the evaluable conditions within root-to-leaf paths of the decision tree 1302, which may ultimately be converted to node chain representations and encoded in aCAM 1412 in FIG. 14. These node chain representations may reflect comparisons of an input data line voltage to a stored analog voltage range having lower and upper voltage bounds defined by the conductances of memristors within the cell of the aCAM that encodes that voltage range.

Root-to-leaf path 1304 may be an example representation of the root-to-leaf path 910 in FIG. 9. Root-to-leaf path 1304 may include the same series of node transitions as the root-to-leaf path 910, specifically, $f_1$ condition 1b→$f_3$ condition 1b→$f_2$ condition 2a→Class 2. With respect to the specific evaluable conditions encoded in decision tree 1302, the series of node transitions for the root-to-leaf path 1304 becomes: $f_1$>0.2→$f_3$<0.7→$f_2$<0.8→Class 2.

As previously described in reference to decision tree 902 in FIG. 9, each decision node in decision tree 1302 (other than the leaf nodes) is associated with an evaluable condition that can result in an "a" outcome or a "b" outcome. The "a" outcome can indicate that the evaluable condition is satisfied (which corresponds to the left branch extending from a decision node). The "b" outcome can indicate that the evaluable condition is not satisfied (which corresponds to the right branch extending from the decision node). Thus, taking the evaluable condition ($f_1$<0.2) of the root node of decision tree 1302 as an example, the "a" outcome is $f_{1<0.2}$ and the "b" outcome is the result of the condition not being satisfied, that is, $f_1 \geq 0.2$.

In some examples, decision tree 1302 may be converted to a tabular representation. This involves, for example, converting each root-to-leaf path in decision tree 1302 to a corresponding node chain in the tabular representation. Converting a root-to-leaf path to a corresponding node chain may include consolidating two or more node transitions from the root-to-leaf path into a single node in the node chain; re-ordering node transitions in the root-to-leaf path to produce a node sequence in the corresponding node chain that is the same as the sequence of features/search variables in the feature vector 1300; and/or generating nodes in the node chain that correspond to "don't care" values for features that are not evaluated in the root-to-leaf path.

For example, converting root-to-leaf path 1304 to node chain 1306 involves re-ordering the node transitions of root-to-leaf path 1304 to sequence the node representing the outcome of evaluating the condition for $f_2$ before the node representing the outcome of evaluating the condition for $f_3$ in node chain 1306. Converting root-to-leaf path 1304 to node chain 1306 further includes associating a "don't care" value with the node corresponding to feature $f_4$ because this feature is not evaluated in root-to-leaf path 1304. An example of consolidating node transitions of a root-to-leaf path is shown with respect to node chain 1310. In particular, node chain 1310 represents the root-to-leaf path in decision tree 1302 given by the following node transitions: $f_1$<0.2→$f_4$<0.75→$f_1 \geq 0.1$→Class 0. The outcomes of evaluating the two conditions involving feature $f_1$ may then be consolidated into a single node in node chain 1310 representing the analog range $0.1 \leq f_1 < 0.2$. Converting the corresponding root-to-leaf path to node chain 1310 may further include re-ordering the node transition involving feature $f_4$ as well as associating a "don't care" value with feature $f_3$.

In example embodiments, each root-to-leaf path traversable in decision tree 1302 may be converted to a respective corresponding node chain in the tabular representation. In some embodiments, decision tree 1302 may be systematically traversed according to a predetermined traversal scheme to identify each root-to-leaf path, and the node chains may be generated and stored in the tabular representation in a same sequence as the root-to-leaf paths are traversed. For instance, the first root-to-leaf path identified in decision tree 1302 may be given by a series of node transitions representing an "a" outcome at each node between the root node and the penultimate node of the root-to-leaf path, specifically, the following series of node transitions: $f_1$<0.2→$f_4 \geq 0.75$→$f_2$<0.8→Class 0. This first root-to-leaf path traversal may then be converted to a first node chain 1308 in the tabular representation. In other example embodiments, the sequence of the node chains in the tabular representation may not exactly correspond to the order in which the root-to-leaf paths are traversed in decision tree 1302 as long as each root-to-leaf path in decision tree 1302 is converted to a corresponding node chain in the tabular representation.

Figure 14:
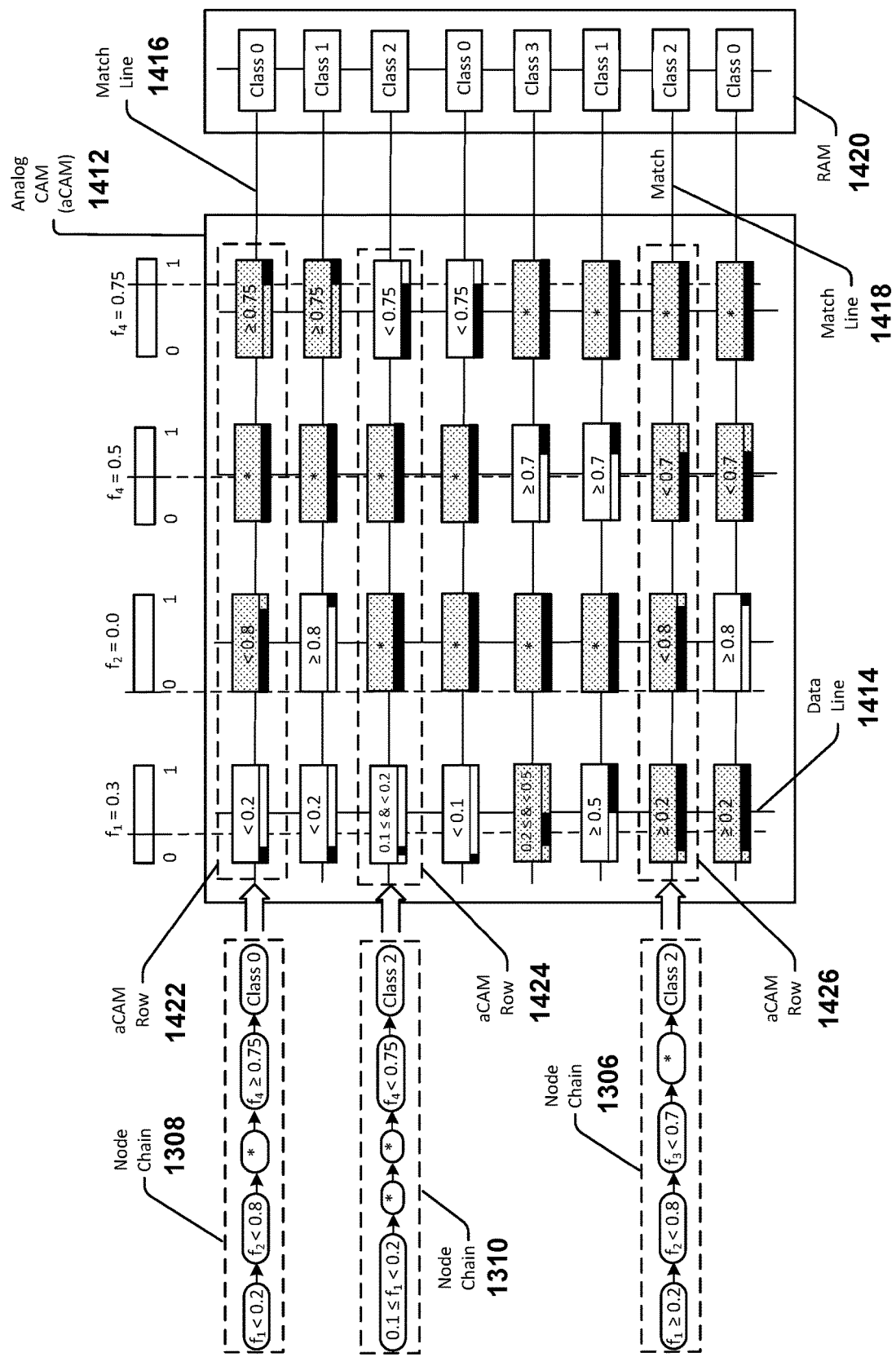
FIG. 14 illustrates an encoding of the set of node chains, in accordance with example embodiments described herein.

FIG. 14 illustrates an encoding of the set of node chains, in accordance with example embodiments described herein. The encoding may correspond with the node chains depicted in FIG. 13 in aCAM 1412 is depicted. aCAM 1412 may include multiple rows and columns of cells. In this illustration, aCAM 1412 includes four columns of cells, with each column corresponding to a respective feature/search variable, and eight rows of cells, with each row corresponding to a respective node chain, which in turn, corresponds to a respective node-to-leaf path in decision tree 1302. In example embodiments, each node chain may be rotated and encoded in the cells of a corresponding row of aCAM 1412. As previously described, each root-to-leaf path, and thus, each corresponding node chain represents a series of evaluable conditions constituting a logical rule such as a domain-related logical rule. After the domain logical rule embodied by the node chain is encoded in aCAM 1412, a search query containing set of search variable inputs (e.g., feature vector 1300) matches the encoded rule if the search variable inputs satisfy the respective evaluable conditions to which they correspond.

In example embodiments, while each row of aCAM 1412 is a stored word representing an encoded domain logical rule, each column of aCAM 1412 includes a collection of cells that stores values or ranges of values associated with evaluable conditions involving the same feature/search variable across the set of domain logic rules. For instance, the cells in the first column of aCAM 1412 together store all of the ranges of analog values associated with evaluable conditions involving feature $f_1$ across the set of node chains (i.e., the set of domain logical rules). Similarly, the cells of the second column of aCAM 1412 store all of the ranges of analog values associated with evaluable conditions involving feature $f_2$ across the set of node chains, the cells of the third column of aCAM 1412 store all of the ranges of analog values associated with evaluable conditions involving feature $f_3$ across the set of node chains, and so forth. It should be appreciated that the re-ordering of the node transitions of a root-to-leaf path when converting the path to a node chain is done, at least in part, to ensure that the proper values are stored in the correct aCAM cells such that a search query can be efficiently searched and matched against each of the stored words in aCAM 1412 (i.e., each row) in parallel.

The encoding of some example node chains in aCAM 1412 is illustratively shown in FIG. 14. As described earlier, each node chain includes a series of nodes that corresponds to a series of evaluable conditions that represent a particular root-to-leaf path in the decision tree 1302. The example node chain 1308, which includes the node sequence: $f_1<0.2 \rightarrow f_2<0.8 \rightarrow * \rightarrow f_4-0.75 \rightarrow$ Class 0, is encoded in first row 1422 of aCAM 1412. Similarly, example node chains 1310, 1306 are encoded in rows 1424, 1426, respectively, of aCAM 1412.

Taking node chain 1306 as an example, the analog range of values given by: $f_1 \geq 0.2$ is encoded in a corresponding cell of the first column of aCAM 1412. In particular, this analog range of values may be encoded by tuning the conductances of the memristors of the aCAM cell to establish a matching voltage range for the aCAM cell that represents the analog range of values. The matching voltage range may be bounded by a lower voltage bound that is a function of the respective conductance $G_{M1}$ of a memristor (M1) in the aCAM cell and that maps to the value 0.2 (or is the value 0.2) and by an upper voltage bound that is a function of the respective conductance $G_{M2}$ of a memristor (M2) in the aCAM cell. The conductance $G_{M2}$ may be tuned such that the upper voltage bound given by $f(G_{M2})$ is above a maximum line voltage that can be applied to data line 1414, which is connected to each of the cells in the first column of aCAM 1412. In this manner, any search input value for feature $f_1$ that is greater than or equal to 0.2 (or that maps to a data line voltage greater than or equal to 0.2) would result in a match for that aCAM cell.

As another non-limiting example, the second evaluable condition $f_{2<0.8}$ in the node chain 1306 is encoded in a corresponding cell in a second column of aCAM 1412. This analog range of values may be encoded by tuning conductances of memristors of the aCAM cell to establish a matching voltage range bounded by a lower voltage bound and an upper voltage bound, where the upper voltage bound is a function of the respective conductance $G_{M2}$ of a memristor (M2) in the aCAM cell that maps to the value 0.8 (or is the value 0.8). The respective conductance $G_{M1}$ of memristor (M1) in the aCAM cell may be tuned such that the lower voltage bound given by $f(G_{M1})$ is below a minimum line voltage that can be applied to a data line connected to each of the cells in the second column of aCAM 1412. In this manner, any search input value for feature $f_2$ that is less than 0.8 would result in a match for that aCAM cell.

In addition, various "don't care" values in the various node chains may be encoded in corresponding cells of the aCAM 412. For instance, encoding node chain 1306 in row 1426 of aCAM 1412 includes encoding a "don't care" value in the aCAM cell in the fourth column of aCAM 1412 that corresponds to feature $f_4$, for which there is no corresponding evaluable condition in the node chain 1306. In example embodiments, a "don't care" value is encoded in an aCAM cell by tuning the respective conductances $G_{M1}$ and $G_{M2}$ of memristors M1 and M2, respectively, to establish a matching voltage range for the cell that is bounded by a lower voltage bound $f(G_{M1})<V_{DL,min}$ and an upper voltage bound $f(G_{M2})>V_{DL,max}$. In this manner, any data line voltage supplied to the aCAM cell—which must be between $V_{DL,min}$ and $V_{DL,max}$—would necessarily also fall between the lower and upper voltage bounds. Thus, any input search value would result in a match for an aCAM cell that encodes a "don't care" value.

In some example embodiments, the final nodes in the node chains—which represent the leaf nodes in decision tree 1302, for example—may be stored in a memory array such as RAM 1420 that is separate from aCAM 1412. This may allow for multiple match results to be returned for search queries that seek to optimize a particular feature/parameter/variable (e.g., the parameter represented by the last node in each node chain). For instance, the "class" parameter values stored in RAM 1420 may represent different connection times in the flight travel search application scenario mentioned earlier or different product costs in the product search scenario mentioned earlier. In some example embodiments, the analog, range, and/or fuzzy search capabilities of aCAM 1412 may be used to search the set of domain-related logical rules for some optimization criterion. That is, the various search capabilities of aCAM 1412 can be leveraged to find rules (e.g., stored words in aCAM 1412) that include a set constrained variables, and optionally, one or more free (i.e., "don't care") variables, and that yield a minimum, maximum, or otherwise optimized value for another variable/parameter.

In example embodiments, a search query represented by feature vector 1300 (<0.3, 0.0, 0.5, 0.75>) may be provided as input to aCAM 1412. The following description of the process of searching and matching the query against the stored contents of aCAM 1412 assumes, for ease of explanation, that the values of feature vector 1300 represent input data line voltages that map to corresponding search variable values specified in a search query, and further assumes that the numeric values to which feature vector values are compared as part of the example evaluable conditions are lower and upper voltage bounds of stored analog voltage ranges that represent the evaluable conditions. While the example feature vector 1300 includes only discrete values, it should be appreciated that an input search variable may be an analog range of values, in which case, the value in feature vector 1300 that corresponds to that input search variable may be an analog voltage range that maps to the analog range of values.

In example embodiments, aCAM 1412 may reside within a computing device. A processor of the computing device may execute machine-executable instructions to cause a low latency, parallel search of aCAM 1412 to be performed based on the search query. The parallel search may include searching input feature vector 1300 against each row in the aCAM 1412 in parallel. In example embodiments, searching the input feature vector 1300 against a given aCAM row includes comparing the value specified for each feature against the stored value or range of values in a corresponding cell of the aCAM row. If (e.g., and only if) each feature value equals a stored value or is within a stored range of values of a corresponding aCAM cell, the aCAM outputs a match for the stored word represented by that aCAM row. A match may be outputted for a given stored word if a voltage on a corresponding match line corresponds to a high logic level (which may be represented by a low voltage or a high voltage on the match line depending on the implementation). A match for a particular stored word indicates that the feature vector 1300 satisfies the evaluable conditions associated with the domain logical rule represented by that stored word. If, on the other hand, at least one feature value does not equal a stored value or is not within a stored analog range of values of a corresponding aCAM cell, that cell may discharge a match line, thereby indicating a mismatch for that stored word.

For example, comparing input feature vector 1300 (e.g., <0.3, 0.0, 0.5, 0.75>) to the stored word encoded at row 1426 of aCAM 1412 results in a match because each input search value in feature vector 1300 satisfies the condition embodied in a corresponding cell of aCAM row 1426. More specifically, the input search value for $f_1$ satisfies the evaluable condition embodied in the first aCAM cell in aCAM row 1426 ($f_1 > 0.2$) if the input search value falls within an analog range of values that represents the evaluable condition and that is stored in the first aCAM cell in aCAM row 1426. In example embodiments, in the case of the evaluable condition $f_1 \geq 0.2$, a match occurs as long the data line voltage to which the input search variable value specified for feature $f_1$ maps is within a stored analog voltage range bounded by a lower voltage bound of 0.2 and an upper voltage bound greater than a maximum data line voltage. Thus, as long as the voltage applied on the data line is at least 0.2 or larger, the aCAM cell will not discharge the match line, thereby indicating a match for that aCAM cell. The other aCAM cells of row 1426 also indicate a match (i.e., do not discharge the match line) because $f_2=0.0<0.2$; $f_3=0.5<0.7$; and $f_4=0.75$ is between 0 and 1. In fact, the aCAM cell in aCAM row 1426 that corresponds to feature $f_4$ always outputs a match because it stores a "don't care" value in the form of an analog voltage range that encompasses any possible data line voltage that may be applied. Because each aCAM cell in aCAM row 1426 matches the corresponding feature value in feature vector 1300, no aCAM cell in aCAM row 1426 discharges match line 1418, thereby maintaining the match line 1418 at the high logic level that is indicative of a matching result.

In example embodiments, the address of the stored word at aCAM row 1426 in aCAM 1412 may be returned. In some example embodiments, the "class" variable may be a parameter that a user seeks to optimize, in which case, the stored word at aCAM row 1426 would only be returned as a matching result for the feature vector 1300 if the corresponding value for the class parameter (i.e., class 2) satisfies the value for the optimized parameter specified in the search query. For example, if the class parameter represents total product cost that a user seeks to minimize in a product search application scenario, the combination of product parameters represented by aCAM row 1426 would be returned as a matching result if the corresponding value stored for the total product cost parameter is less than a maximum allowable value specified in the search query.

In some examples, feature vector 1300 only produces a matching result for the stored word at aCAM row 1426 and may result in a mismatch for each other stored word. For example, the aCAM cell that produces a match for a corresponding feature value in the feature vector 1300 is depicted with shading. In this example, aCAM row 1426 is the only stored word for which each aCAM cell in the row 1426 is shown with shading, thereby indicating a match. For each other stored word in aCAM 1412, at least one feature value specified in the feature vector 1300 does not produce a match with respect to a corresponding aCAM cell. For instance, the feature vector 1300 produces a match for the aCAM cells in the second, third, and fourth columns of aCAM 1412. Feature vector 1300, however, results in a mismatch with respect to feature $f_1$. In particular, the analog voltage range bounded by a lower bound of 0 and an upper bound of 0.2 that is encoded in the first aCAM cell of row 1422 does not include $f_{1=0.3}$. This results in a pull-down transistor of the aCAM cell turning on and discharging the match line 1416, thereby indicating a mismatch for the stored word at row 1422. Each other stored word in aCAM 1412 (other than the stored word at row 1426) produces a mismatch for the feature vector, including the stored word at row 1424, which produces a match for the stored "don't care" values for features $f_2$ and $f_3$, but a mismatch with respect to the stored analog ranges of values for features $f_1$ and $f_4$.

Figure 15:
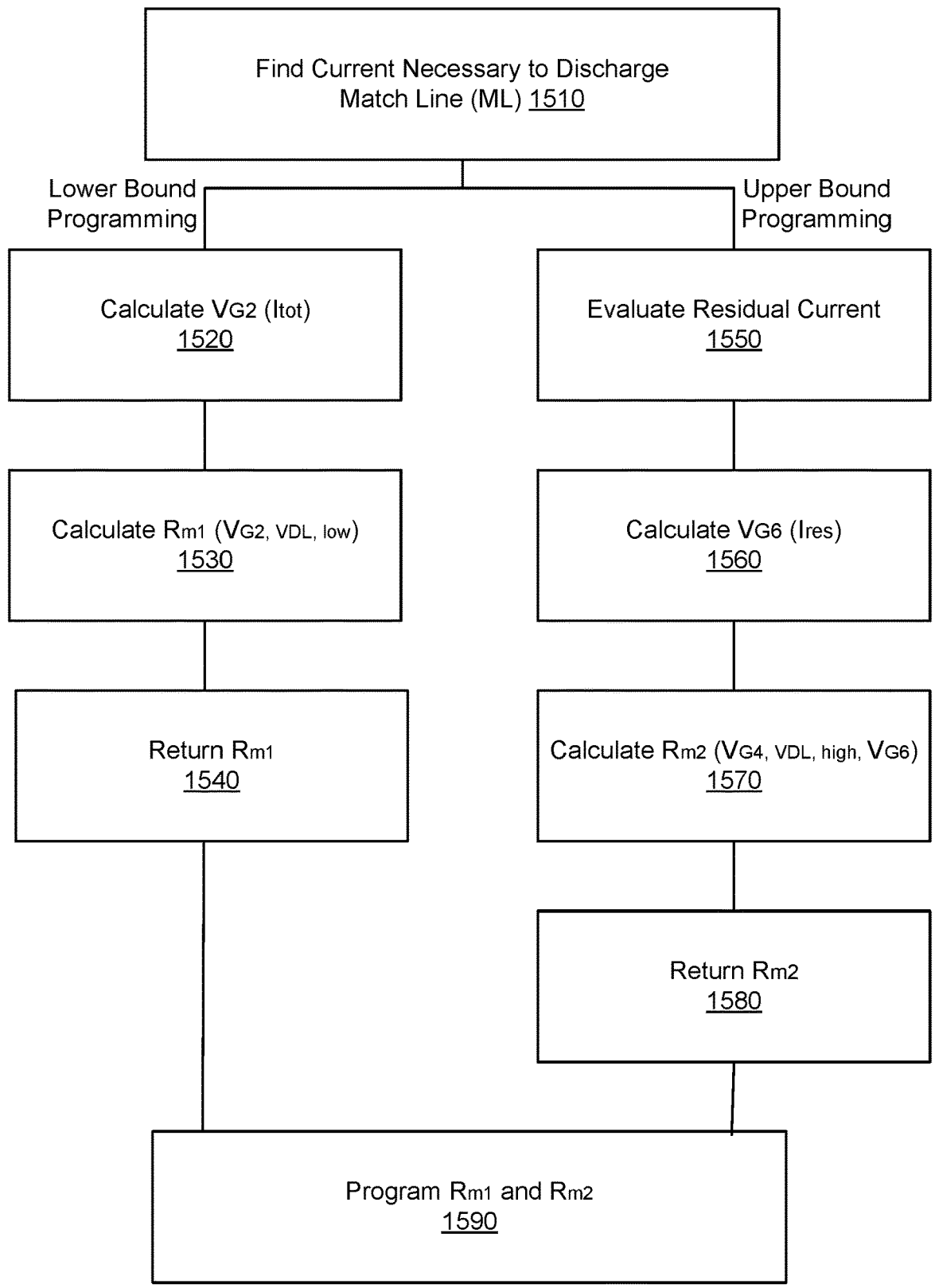
FIG. 15 illustrates a programming process of aCAM cells, in accordance with example embodiments described herein.

Improved programming may be implemented on aCAM structures discussed herein. One programming process of aCAM cells is provided with FIG. 15, which may be implemented by one or more aCAM structures discussed herein. This programming process may improve programming of a target analog voltage range in the aCAM and increase usability of the aCAM by considering a voltage discharge contribution of each cell along with the overall match line (ML) capacitance (e.g., the prog_naive algorithm).

At block 1510, find a current necessary to discharge the match line (ML). Various information may be determined prior to finding the current necessary to discharge the ML. For example, the current may be determined once a target lower threshold $V_{DL,low}$ and a target upper threshold $V_{DL,high}$ is given. The aCAM may also be operating with a clocked system with clock time $t_{CLK}$, a match line (ML) pre-charged with $V_{ML0}$, and a sense amplifier threshold of $V_{sense}$. The sense amplifier threshold may help ensure that the output is high if $V_{ML}$ is greater than $V_{sense}$.

The overall capacitance on the ML is $C_{ML}=C_{PC}+C_{SA}+WC_{aCAM}$ with $C_{PC}$ capacitance introduced by the pre-charge circuit, $C_{SA}$ capacitance introduced by the SA circuit, $C_{aCAM}$ capacitance introduced by the analog CAM and W the number of aCAM cells in a row.

The total current to discharge ML is:

$$i_{tot} = (V_{ML0} - V_{sense}) * \frac{C_{ML}}{t_{CLK}}$$

At block 1520, lower bound programming may be initiated by calculating $V_{G2}$ ($i_{tot}$).

At block 1530, calculate the needed $R_{M1}(V_{G2}, V_{DL,low})$ which provides enough current for discharging the ML.

At block 1540, return $R_{M1}$.

At block 1550, upper bound programming may be initiated. For example, the programming may evaluate the residual current that should discharge the ML given the current generated by the lower bound when the upper threshold to store is applied $i_{res}=i_{tot}-i_{lower}(V_{DL,high},R_{M1})$.

At block 1560, calculate $V_{G6}(i_{res})$.

At block 1570, calculate $R_{M2}$ ($V_{G4}>V_{DL,high}$, $V_{G6}$) which provides enough current for discharging the ML.

At block 1580, return $R_{M1}$ and $R_{M2}$.

At block 1590, program the $R_{M1}$ and $R_{M2}$ that is returned at blocks 1540 and 1580. In some examples, the programming may be implemented in parallel or concurrently. In other examples, the programming may be implemented sequentially (e.g., first $R_{M1}$ and then $R_{M2}$).

The target low and target high can be determined or provided using processes described throughout the disclosure. Multiple cells in an aCAM row can be programmed using the $R_{M1}$ and $R_{M2}$ values (e.g., the prog_row algorithm).

For example, using the following vector T corresponding with cell 1, cell 2, and cell 3 in a row of the aCAM:

$$T = \begin{bmatrix} T_{1,1} & T_{1,2} & T_{1,3} \\ T_{2,1} & T_{2,1} & T_{3,1} \end{bmatrix}$$

In this example, W=3 (for the three aCAM cells in a row), however any value of rows may be implemented in a given hardware. To program a row in the aCAM, the following values may be provided: T, $V_{sense}$, W, $t_{clk}$. These values may be incorporated with the following function:

for k=1, 2, ... w $R_M[1,k], R_M[2,k]$=prog_naive($T[1,k], T[2,k], V_{sense}, W, t_{clk}$)

Once the values for all of the cells are calculated, the process may return $R_M$.

Figure 16:
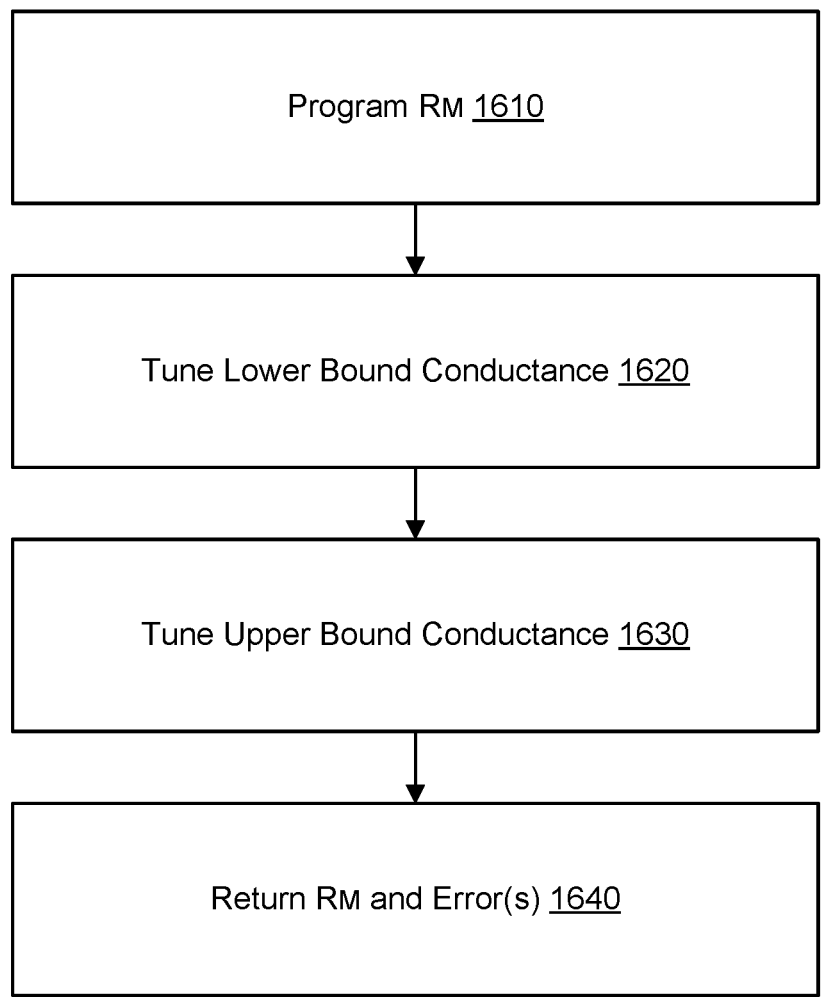
FIG. 16 illustrates programming a row of the aCAM, in accordance with example embodiments described herein.

FIG. 16 illustrates programming a row of the aCAM, in accordance with example embodiments described herein. As illustrated, FIG. 16 may implement a programming step in the loop. $R_M$ is computed with the prog_row function (shown herein) and programmed, then it is tested with the lower and upper bound conductance until convergence.

At block 1610, attempt to program $R_M$=prog_row(T, $V_{sense}$, W, $t_{clk}$).

At block 1620, tune a lower bound conductance. During the tuning of the lower bound conductance, the variables "converged" and "error" may be initialized to "true."

The process may evaluate voltage on the ML when the lower target is applied as $V_{ML}(R_M, T[1,:]t_{clk})$. If $V_{ML}<V_{sense}$ then the variable "converged" may be set to "false" and $V_{sense,now}=V_{sense}$. While the process has converged, converged==False OR error==False.

The process may increase the sense voltage by $\delta V\_step$ in order to reduce current $i_{tot}$ in the prog_naive algorithm. Other variables may be set as well, including $V_{sense,now}=V_{sense,now}+\delta V_{step}$ and if $V_{sense,now}>V_{ML0}\rightarrow$error=True. The "error" variable may be set to true based on the difficulty of programming the correct range.

In some examples, the process may try to program an aCAM row by keeping upper bound conductance $R_{M2}$ fixed. For example, $R_{M,temp}$ prog_row(T, $V_{sense\_now}$, W, $t_{clk}$) as illustrated at block 1610 and $R_M[1,:]$ $R_{M,temp}$ [1:].

The process may evaluate voltage on ML when lower target is applied as $V_{ML}(R_M, T[1,]t_{clk})$ and consider if $V_{ML}>V_{sense}\rightarrow$converged=True.

At block 1630, tune an upper bound conductance. During the tuning of the upper bound conductance, initialize "converged" and "error" may be initialized to "true."

The process may evaluate the voltage on the ML when upper target is applied as $V_{ML}(R_M, T[2,:]t_{clk})$. If $V_{ML}<V_{sense}$ then the variable "converged" may be set to "false" and $V_{sense,now}=V_{sense}$. While the process has converged, converged==False OR error==False.

The process may increase the sense voltage by $\delta V\_step$ in order to reduce current $i_{tot}$ in the prog_naive algorithm. Other variables may be set as well, including $V_{sense,now}=V_{sense,now}+\delta V_{step}$ and if $V_{sense,now}>$ $V_{ML0}\rightarrow$error=True. The "error" variable may be set to true based on the difficulty of programming the correct range.

In some examples, the process may try to program an aCAM row by keeping lower bound condutance $R_{M1}$ fixed. For example, $R_{M,temp}$=prog_row(T, $V_{sense,now}$, W, $t_{clk}$) as illustrated at block 1610 and $R_M$ $[^2,:]$ $R_{M,temp}$ $[^2:]$.

The process may evaluate voltage on ML when upper target is applied as $V_{ML}(R_M, T[2,:], t_{clk})$ and consider if $V_{ML}>V_{sense}\rightarrow$converged=True.

At block 1640, return $R_M$ (and any errors that may occur).

Figure 17:
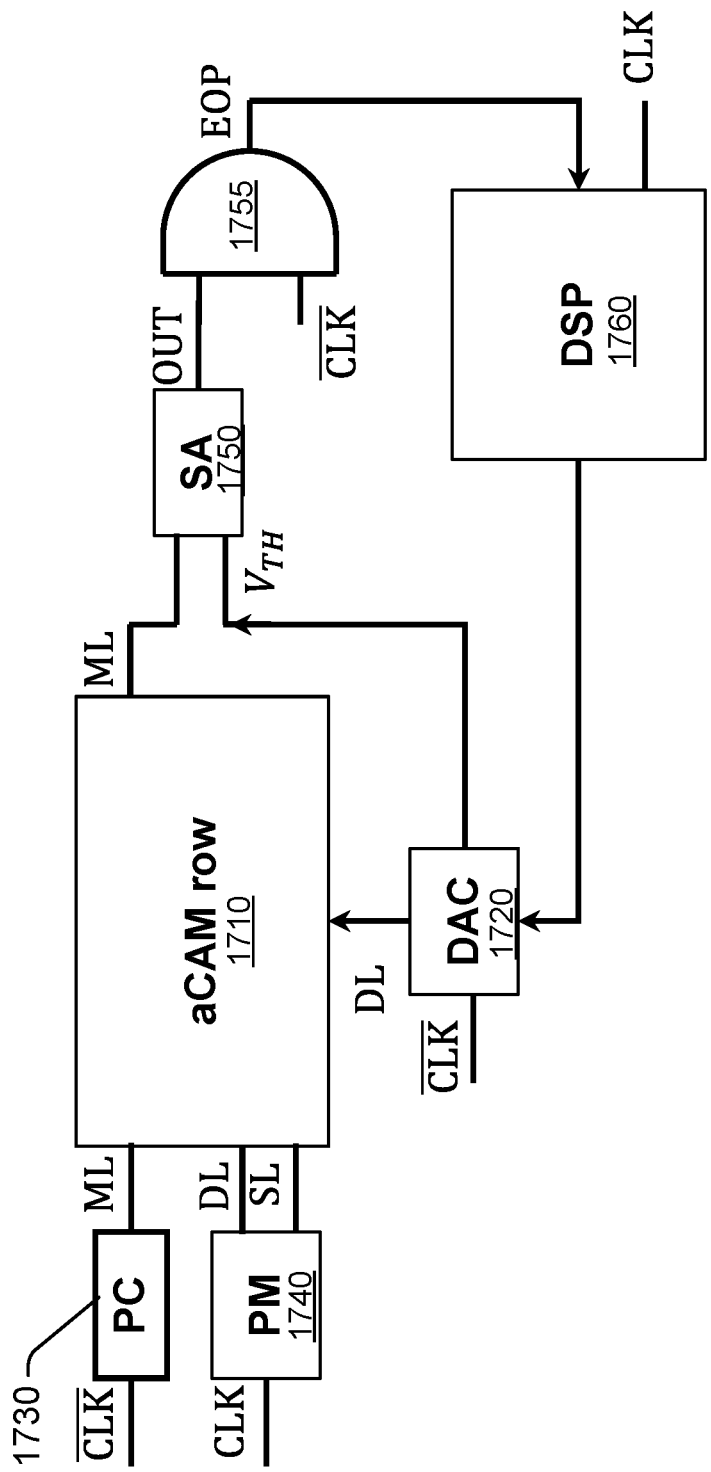
FIG. 17 illustrates a block diagram of programming logic circuit implementation, in accordance with example embodiments described herein.

FIG. 17 illustrates a block diagram of programming logic circuit implementation, in accordance with example embodiments described herein. In the illustration, a circuit is provided for efficiently implementing the programming methods described herein in hardware. The overhead of the circuit may be small because the peripheral circuit may be present for operating the aCAM array. There may be a limited overhead in the digital signal processor (DSP) 1760.

Figure 18:
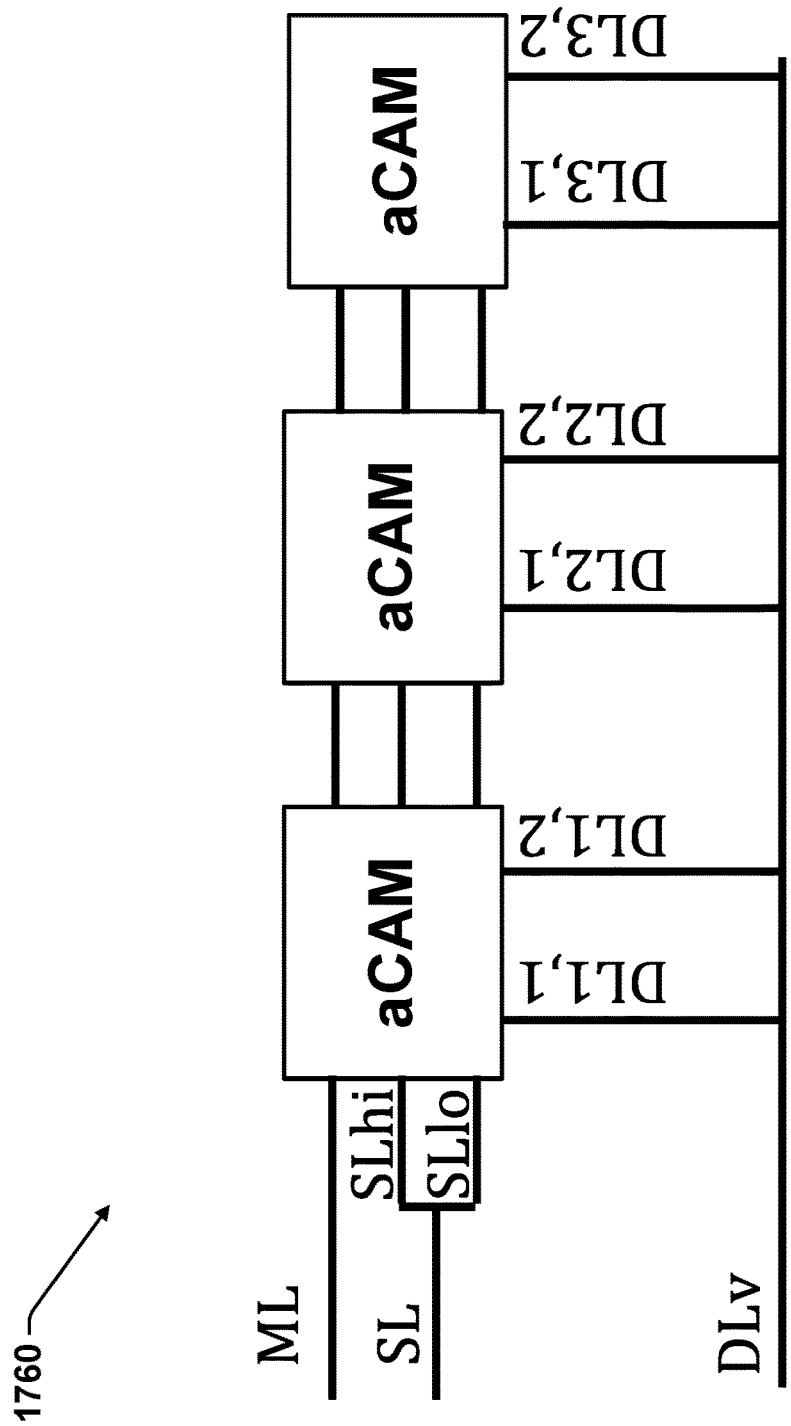
FIG. 18 illustrates a block diagram of an aCAM row, in accordance with example embodiments described herein

At block 1710, a simplified analog content addressable memory (aCAM) row is provided. Components of the aCAM array is provided throughout the disclosure. As an illustrative example, the aCAM array may include three cells, as illustrated in FIG. 18.

At block 1720, a digital-to-analog converter (DAC) circuit block is provided. The DAC may receive a digital input and return an analog output for DL and $V_{sense}$.

At block 1730, a pre charge circuit block (PC) is provided. The PC may receive a clock value. The PC circuit block may be a clocked, pre-charged, circuit block. The output from the PC circuit block may provide charges to the ML as $V_{ML0}$ when input clock is high.

At block 1740, a programming circuit block (PM) is provided. The PM may be a memristor conductance programming circuit block that can execute the prog_row algorithm when triggered.

At block 1750, a sense amplifier circuit block (SA) is provided. The OUT value may be high if the voltage on ML is higher than $V_TH$.

At block 1755, an AND gate is provided. The AND gate may perform a Boolean function or logical operation between the output of block 1750 and the clock value. The output of AND gate may generate an End Of Programming (EOP) bit that is provided to block 1760.

The EOP bit corresponds with a digital/binary signal which can only assume zero and one values. It stays at zero unless the programming is over (i.e. the ML stays high after testing the DL properly with the target pattern), otherwise the EOP moves to one. As an illustrative example, the EOP bit may be high if the search result is a match and the clock signal is received (i.e. successful programming achieved as the row of the aCAM ML stays high).

At block 1760, a digital signal processing (DSP) unit controlling the circuit is provided. The DSP may receive the EOP bit. If the EOP is high (e.g., one), the process may stop because the CAM_PV has converged. If the EOP is low (e.g., zero), the process may send to DAC the new values to output as analog values in DL and $V_{sense}$ for testing the ML. If $V_{sense}>V_{ML0}$ then stop the CAM_PV as an error.

Various problems may be solved. For example, although the traditional aCAM is very powerful due to the compressed multibit representation compared with TCAM and the possibility to unleash new applications such as tree-based machine learning, programming it can be difficult. The difficulty of the programming may be based on, for example, gradual ML discharge as function $V_{DL}$ in the left branch (lower bound), circuit non idealities such as parasitic resistance/capacitance due to interconnects, electronic noise in SA or in the pre charge circuit, and/or non-linearity in the memristor resistance. These limitations can hinder the use of large aCAM arrays and limit performance (for example number of bits/cell) in smaller arrays.

The processes discussed herein can improve the aCAM programming process. for example, the programming can operate the aCAM in array configuration, increase the number of bits per cell, and/or increase the maximum array width (columns). The algorithms discussed herein can be parasitic aware and maximize the number of possible stored elements for a given array width. The capacitance on the ML can be increased by directly sensing it. additionally, the programming allows for writing a fuzzy threshold for tree-based machine learning applications.

Figure 19:
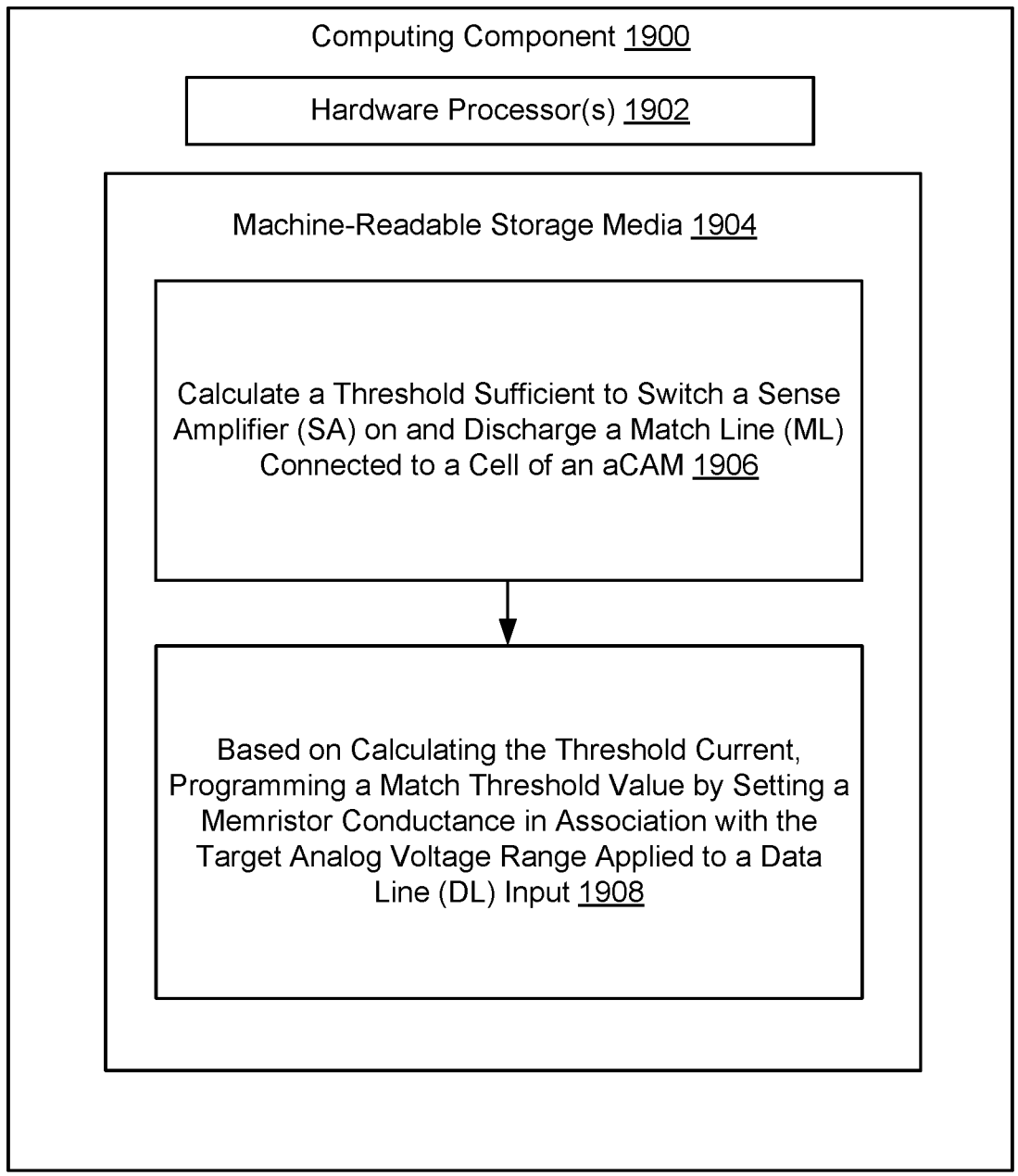
FIG. 19 depicts a set of executable instructions stored in machine-readable storage media that, when executed, cause one or more hardware processors to perform an illustrative method for programming a target analog voltage range of an aCAM according to example embodiments of the invention.

FIG. 19 depicts a computing component 1900 that includes one or more hardware processors 1902 and machine-readable storage media 1904 storing a set of machine-readable/machine-executable instructions that, when executed, cause the hardware processors 1902 to perform an illustrative method for programming a target analog voltage range of an analog content addressable memory (aCAM) row according to example embodiments of the invention.

The computing component 1900 may be, for example, the computing system 900 depicted in FIG. 9. The hardware processors 1902 may include, for example, the processor(s) 904 depicted in FIG. 9 or any other processing unit described herein. The machine-readable storage media 1904 may include the main memory 906, the read-only memory (ROM) 908, the storage 910, and/or any other suitable machine-readable storage media described herein.

At block 1906, the hardware processor(s) 1902 may execute machine-readable/machine-executable instructions stored in the machine-readable storage media 1904 to calculate a threshold sufficient to switch a sense amplifier (SA) on and discharge a match line (ML) connected to a cell of the aCAM.

At block 1908, the hardware processor(s) 1902 may execute machine-readable/machine-executable instructions stored in the machine-readable storage media 1904 to program a match line (ML) value. For example, based on calculating the threshold current, the instructions may program a match threshold value by setting a memristor conductance in association with the target analog voltage range applied to a data line (DL) input.

Figure 20:
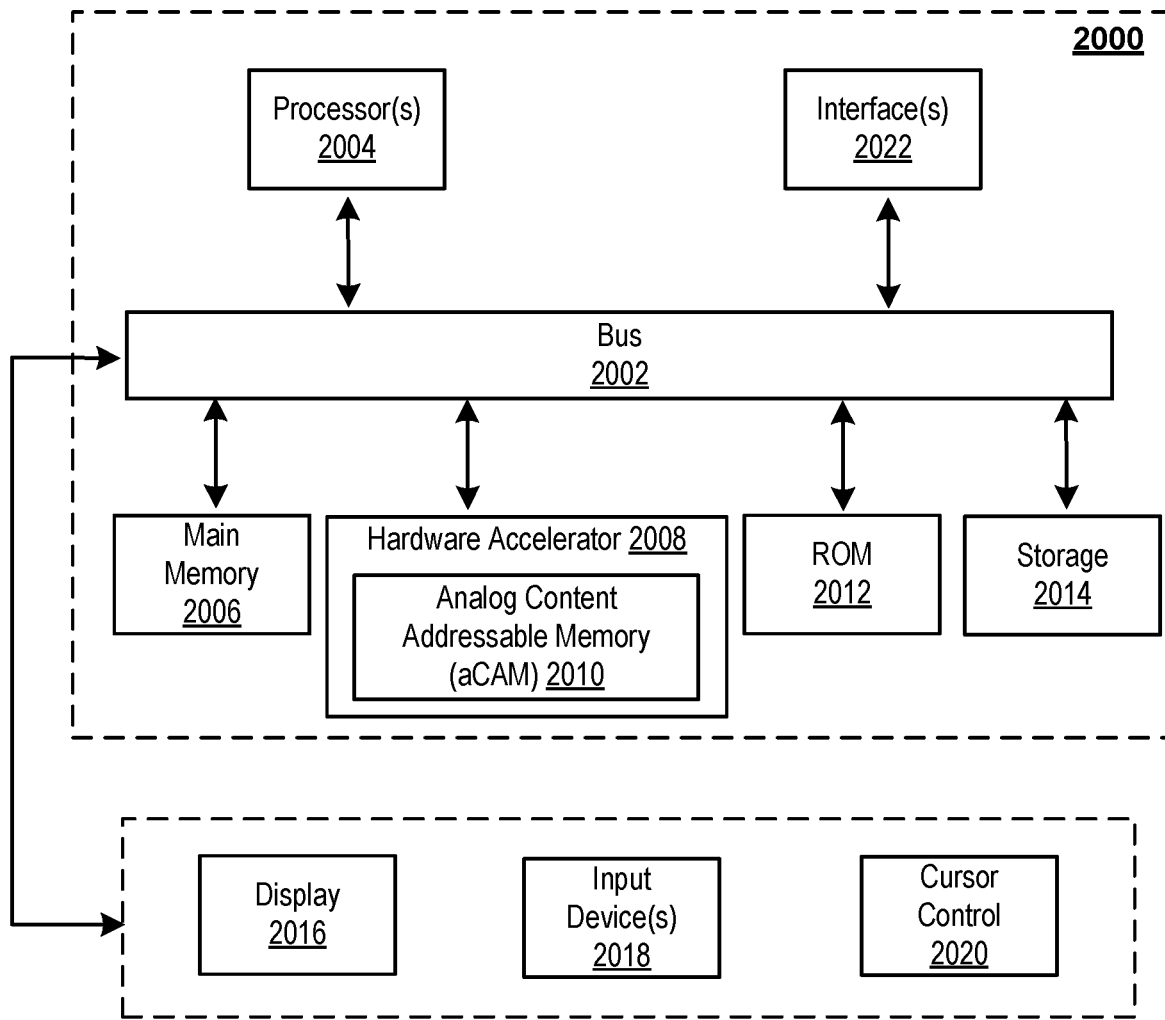
FIG. 20 is an example computing component that may be used to implement various features of example embodiments of the invention.

FIG. 20 depicts a block diagram of an example computer system 2000 in which various of the embodiments described herein may be implemented. The computer system 2000 includes bus 2002 or other communication mechanism for communicating information, one or more hardware processors 2004 coupled with bus 2002 for processing information. Hardware processor(s) 2004 may be, for example, one or more general purpose microprocessors.

Computer system 2000 also includes main memory 2006, such as a random access memory (RAM), cache and/or other dynamic storage devices, coupled to bus 2002 for storing information and instructions to be executed by processor 2004. Main memory 2006 also may be used for storing temporary variables or other intermediate information during execution of instructions to be executed by processor 2004. Such instructions, when stored in storage media accessible to processor 2004, render computer system 2000 into a special-purpose machine that is customized to perform the operations specified in the instructions.

Computer system 2000 additionally includes hardware accelerator 2008. Hardware accelerator 2008 may be configured to execute instructions (i.e. programming or software code) stored in the main memory 2006, read-only memory (ROM), and/or storage 2014 to encode a set of logical rules embodied in a data structure (e.g., the decision tree 904) into aCAM array 2010. In an example implementation, the exemplary hardware accelerator 2008 may include multiple integrated circuits, which in turn, can include Application-Specific Integrated Circuits (ASICs), Field Programmable Gate Arrays (FPGAs) or other Very Large Scale Integrated circuits (VLSIs). The integrated circuits of the exemplary hardware accelerator 2008 may be specifically optimized to perform a discrete subset of computer processing operations, or execute a discrete subset of computer-executable instructions, in an accelerated manner. For example, hardware accelerator 2008 may be configured or manufactured to implement a set of logical rules embodied in a data structure such as the decision tree 902 on the aCAM array.

aCAM array 2010 may include a non-volatile memory built using technologies that include for instance, resistive switching memory (i.e. memristor), phase change memory, magneto-resistive memory, ferroelectric memory, some other resistive random access memory device (Re-RAM), or combinations of those technologies. More generally, the aCAM array 2010 may be implemented using technologies that permit aCAM 2010 to hold its contents even when power is lost or otherwise removed. Thus, data in the aCAM 2010 "persists" and the aCAM 2010 can act as what is known as a "non-volatile memory."

Computer system 2000 further includes read only memory (ROM) 2012 or other static storage device coupled to bus 2002 for storing static information and instructions for processor 2004. Storage device 2014, such as a magnetic disk, optical disk, or USB thumb drive (Flash drive), etc., is provided and coupled to bus 2002 for storing information and instructions.

Computer system 2000 may be coupled via bus 2002 to display 2016, such as a liquid crystal display (LCD) (or touch screen), for displaying information to a computer user. Input device 2018, including alphanumeric and other keys, is coupled to bus 2002 for communicating information and command selections to processor 2004. Another type of user input device is cursor control 2020, such as a mouse, a trackball, or cursor direction keys for communicating direction information and command selections to processor 2004 and for controlling cursor movement on display 2016. In some embodiments, the same direction information and command selections as cursor control may be implemented via receiving touches on a touch screen without a cursor.

The computing system 2000 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

Computer system 2000 may implement the techniques described herein using customized hard-wired logic, one or more ASICs or FPGAs, firmware and/or program logic which in combination with the computer system causes or programs computer system 2000 to be a special-purpose machine. According to one embodiment, the techniques herein are performed by computer system 2000 in response to processor(s) 2004 executing one or more sequences of one or more instructions contained in main memory 2006. Such instructions may be read into main memory 2006 from another storage medium, such as storage device 2010. Execution of the sequences of instructions contained in main memory 2006 causes processor(s) 2004 to perform the process steps described herein. In alternative embodiments, hard-wired circuitry may be used in place of or in combination with software instructions.

The term "non-transitory media," and similar terms such as machine-readable storage media, as used herein, refers to any media that store data and/or instructions that cause a machine to operate in a specific fashion. Such non-transitory media may comprise non-volatile media and/or volatile media. Non-volatile media includes, for example, optical or magnetic disks, such as storage device 2010. Volatile media includes dynamic memory, such as main memory 2006. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 2002. Transmission media can also take the form of acoustic or light waves, such as those generated during radio-wave and infra-red data communications.

Computer system 2000 also includes a communication interface 2022 coupled to bus 2002. Communication interface 2022 provides a two-way data communication coupling to one or more network links that are connected to one or more local networks. For example, communication interface 2022 may be an integrated services digital network (ISDN) card, cable modem, satellite modem, or a modem to provide a data communication connection to a corresponding type of telephone line. As another example, communication interface 2022 may be a local area network (LAN) card to provide a data communication connection to a compatible LAN (or WAN component to communicate with a WAN). Wireless links may also be implemented. In any such implementation, communication interface 2022 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 2022, which carry the digital data to and from computer system 2000, are example forms of transmission media.

Computer system 2000 can send messages and receive data, including program code, through the network(s), network link and communication interface 2022. In the Internet example, a server might transmit a requested code for an application program through the Internet, the ISP, the local network and the communication interface 2022.

The received code may be executed by processor 2004 as it is received, and/or stored in storage device 2010, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 2000.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit for efficiently implementing the programming method in hardware comprising:
   an analog content addressable memory (aCAM) array;
   a digital-to-analog converter (DAC) circuit block;
   a pre charge circuit block (PC);
   a programming circuit block (PM);
   a sense amplifier circuit block (SA);
   an AND gate; and
   a digital signal processing (DSP) unit controlling the circuit.

2. The circuit of claim 1, wherein the DAC circuit block receives a digital input and returns an analog output for a data line (DL) voltage and a voltage of the SA ($V_{sense}$).

3. The circuit of claim 1, wherein the PC receives a clock value and returns a charge to a match line (ML) when the clock value is high.

4. The circuit of claim 1, wherein the PM is a memristor conductance programming circuit block that executes an algorithm when triggered.

5. The circuit of claim 1, wherein the SA returns a high value if the voltage on match line (ML) is higher than an output from the DAC circuit block.

6. The circuit of claim 1, wherein the DSP unit controlling the circuit receives an End Of Programming (EOP) bit from the AND gate and stops the process based on the EOP bit.

* * * * *